(12) United States Patent
Katsura et al.

(10) Patent No.: US 6,636,700 B2
(45) Date of Patent: Oct. 21, 2003

(54) FLASH DEVICE, LENS-FITTED PHOTO FILM UNIT, CAMERA, LIGHT MEASURING DEVICE, AND METHOD OF PRODUCING LENS-FITTED PHOTO FILM UNIT

(75) Inventors: Hirofumi Katsura, Minami-Ashigara (JP); Takashi Imamura, Minami-Ashigara (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/135,450

(22) Filed: May 1, 2002

(65) Prior Publication Data

US 2002/0164163 A1 Nov. 7, 2002

(30) Foreign Application Priority Data

May 2, 2001 (JP) .................................... 2001-134886
May 11, 2001 (JP) .................................... 2001-141550
May 14, 2001 (JP) .................................... 2001-143467

(51) Int. Cl.[7] .............................................. G03B 15/05
(52) U.S. Cl. ........................ 396/159; 396/162; 396/176; 396/206

(58) Field of Search ............................ 396/6, 159, 205, 396/206, 162, 176, 542

(56) References Cited

U.S. PATENT DOCUMENTS 4,449,802 A * 5/1984 Nakamura ................... 396/159
6,466,744 B1 * 10/2002 Hosaka et al. .......... 396/206 X

* cited by examiner

Primary Examiner—W. B. Perkey
(74) Attorney, Agent, or Firm—Young & Thompson

(57) ABSTRACT

A lens-fitted photo film unit is pre-loaded with photo film, and is a flash built-in type. A booster circuit boosts power source voltage to obtain high voltage. A main capacitor stores charge at the high voltage. A flash discharge tube is connected with the main capacitor, and emits flash light by discharge at the high voltage. A trigger circuit triggers the discharge of the flash discharge tube in response to an exposing operation. A main circuit board has the booster circuit and the trigger circuit mounted thereon. A subsidiary circuit board is connected with the main circuit board, and has a flash quenching circuit mounted thereon. The flash quenching circuit operates in an auxiliary manner, and automatically adjusts the amount of the flash light.

27 Claims, 26 Drawing Sheets

FLASH DEVICE, LENS-FITTED PHOTO FILM UNIT, CAMERA, LIGHT MEASURING DEVICE, AND METHOD OF PRODUCING LENS-FITTED PHOTO FILM UNIT

BACKGROUND OF THE INVENTION

1. Field of the Invention

The present invention relates to a flash device, a lens-fitted photo film unit, a camera, a light measuring device, and a method of producing lens-fitted photo film unit. More particularly, the present invention relates to a flash device of which circuit elements can be disposed in an economized space, and a lens-fitted photo film unit, a camera, a light measuring device, and a method of producing lens-fitted photo film unit in connection with the structure of the flash device.

2. Description Related to the Prior Art

A lens-fitted photo film unit is well-known, which is pre-loaded with unexposed photo film, and is easily used for taking an exposure as soon as a user purchases it. There are types of the lens-fitted photo film unit having a built-in flash device, which can illuminate a photographic field even at night or indoors. The flash device is a unified device in which circuit elements for flash emitting operation are mounted on a single circuit board. Among the plural types of the lens-fitted photo film unit, the flash device is used as a common part.

As the lens-fitted photo film unit has a simplified and small construction, an aperture stop is fixed. An underexposed or overexposed condition is likely to occur according to an amount of light of a scene. To solve such a problem, there have been proposals to incorporate an exposure adjusting structure in the lens-fitted photo film unit. It is preferable to automate the control of the exposure in consideration of users unskilled in handling of a camera. Thus, there is a suggestion of incorporating a light measuring circuit in the lens-fitted photo film unit for the AE control.

An example of controlling an exposure by the light measuring circuit is an auto flash device, which is the flash device of an automatic light adjusting structure for preventing an object from being photographed with an excessively whitish manner, which occurs typically in close-up photography with flash at a near distance. The auto flash device measures reflected flash light from the object, effects integration, and quenches emission of flash light when the integrated light amount comes up to a predetermined level.

If the single circuit board is provided with circuit elements for the purpose of providing the flash device with a structure for effecting photometry, it is necessary to dispose the circuit elements in a high mounting density, or to enlarge the area of the circuit board. If a manufacturer intends considerably high density of mounting the circuit elements, precision in the assembling the circuit elements or in wire printing of the circuit board must be high. This causes an unwanted increase in the manufacturing cost.

If one intends enlargement of the circuit board, the lens-fitted photo film unit must have a larger size itself. There occurs a problem in that the compact feature of the lens-fitted photo film unit is lost. Furthermore, a problem in the manufacture lies in that the flash device with the light measuring circuit must be produced in a manner separate from the flash device without the light measuring circuit. It is impossible to use the flash device commonly between types of the lens-fitted photo film unit, as the circuit board cannot be readily treated board by board.

SUMMARY OF THE INVENTION

In view of the foregoing problems, an object of the present invention is to provide a flash device of which circuit elements can be disposed in an economized space, and can have compatibility between plural types of flash built-in optical instrument, and a lens-fitted photo film unit, a camera, a light measuring device, and a method of producing lens-fitted photo film unit in connection with the structure of the flash device.

In order to achieve the above and other objects and advantages of this invention, a flash device comprises a main capacitor for storing charge at high voltage for emission of flash light. A main circuit board is connected with the main capacitor, and has a main circuit element group mounted thereon, the main circuit element group being adapted for the flash emission. A subsidiary circuit board is connected with the main circuit board, and has an auxiliary circuit element mounted thereon, the auxiliary circuit element operating in an auxiliary manner to the main circuit element group.

Furthermore, a flash discharge tube is connected with the main capacitor, for emitting the flash light by discharge at the high voltage. The main circuit element group includes a booster circuit connected with the main capacitor, for boosting power source voltage to obtain high voltage. A trigger circuit triggers the discharge of the flash discharge tube in response to an exposing operation.

The main capacitor includes a pair of capacitor terminal pins by which the main and subsidiary circuit boards are connected with one another.

The subsidiary circuit board is oriented substantially perpendicularly to the main circuit board.

The auxiliary circuit element constitutes a flash quenching circuit for obtaining a light amount of reflected light from a photographic field illuminated by the flash light, and for outputting a quench signal for discontinuing operation of the flash discharge tube upon a reach of the light amount at a predetermined level.

The main circuit element group further includes a sync switch for being turned on in synchronism with the exposing operation, to operate the trigger circuit. Furthermore, a photometric element is mounted on the subsidiary circuit board, for measuring the reflected light from the photographic field illuminated by the flash light, and for outputting a photometric signal. The flash quenching circuit obtains the light amount by integration of the photometric signal.

According to another aspect of the invention, a flash device comprises a booster circuit for boosting power source voltage to obtain high voltage. A main capacitor for stores charge at the high voltage. A flash discharge tube is connected with the main capacitor, for emitting flash light by discharge at the high voltage. A trigger circuit triggers the discharge of the flash discharge tube in response to an exposing operation. A main circuit board has the booster circuit and the trigger circuit mounted thereon. A photometric element measures reflected light from a photographic field illuminated by the flash light, and for outputting a photometric signal. A flash quenching circuit obtains a light amount by integration of the photometric signal, and for outputting a quench signal for discontinuing operation of the flash discharge tube upon a reach of the light amount at a predetermined level. A subsidiary circuit board is connected with the main circuit board, and has the photometric element and the flash quenching circuit mounted thereon, the main capacitor being connected with the subsidiary circuit board electrically and in a firmly fastened manner.

Furthermore, a choke coil has one end portion connected with the main capacitor, and a remaining end portion connected with a circuit element included in the flash quenching circuit, for protecting the circuit element from a current of a high frequency generated upon the discharge of the main capacitor.

Furthermore, a bobbin is secured to an outer surface of the main capacitor, for winding the choke coil thereabout. The subsidiary circuit board and the main capacitor constitute a main capacitor unit.

Furthermore, a projection is formed on the bobbin, for positioning the subsidiary circuit board on the main capacitor.

The main capacitor includes a pair of capacitor terminal pins by which the main and subsidiary circuit boards are connected with one another.

In another preferred embodiment, the subsidiary circuit board includes a pair of line-shaped subsidiary board terminal patterns by which the main circuit board and the main capacitor are connected with one another.

In still another preferred embodiment, furthermore, a photoreceptor element measures ambient light from the photographic field. An exposure control circuit is mounted on the main circuit board, for sending an ambient light state signal to the flash quenching circuit according to an output from the photoreceptor element. The flash quenching circuit determines the predetermined level of the light amount of the reflected light in consideration of the ambient light state signal.

The subsidiary circuit board is fastened on the main circuit board in a direction perpendicular thereto. The exposure control circuit includes an output terminal disposed on a contact surface of the main circuit board opposed to the subsidiary circuit board, for outputting the ambient light state signal. The flash quenching circuit includes an input terminal disposed on a contact surface of the subsidiary circuit board opposed to the main circuit board, and connected with the output terminal.

According to still another aspect of the invention, a flash device includes a discharge tube case, secured to the main circuit board, for containing the flash discharge tube. A subsidiary circuit board is connected with the main circuit board, secured to the discharge tube case, and has the photometric element and the flash quenching circuit mounted thereon, the main capacitor being connected with the subsidiary circuit board electrically and in a firmly fastened manner.

Furthermore, a support plate is secured to the discharge tube case, for retaining the subsidiary circuit board.

The support plate is secured to a rear of the discharge tube case to extend substantially in parallel with the subsidiary circuit board.

According to another aspect of the invention, a lens-fitted photo film unit of a flash built-in type is provided, is pre-loaded with photo film, and includes the flash device of the above construction.

Furthermore, a main body has the main and subsidiary circuit boards secured thereto, has a cassette holder chamber and a photo film chamber, the cassette holder chamber being loaded with a photo film cassette, the photo film chamber being loaded with photo film from the photo film cassette in a roll form. Front and rear covers cover respectively a front and a rear of the main body. An externally operable charger button is disposed in the front cover. A charger power switch is disposed behind the charger button, for being turned on by operation of the charger button, to power the booster circuit.

According to a further aspect of the invention, a camera of a flash built-in type is provided, and includes the flash device of the above construction.

According to another aspect of the invention, a producing method of producing a lens-fitted photo film unit is provided. In the producing method, the flash device is set between the main body and the front cover by positioning the charger power switch at the charger button, positioning the sync switch relative to the shutter blade, and positioning the photometric element at the photometric window. After the flash device is set, the photo film cassette is set into the cassette holder chamber, and the photo film into the photo film chamber.

Furthermore, a middle of a pair of terminal pins of the main capacitor is attached to the subsidiary circuit board by insertion through holes or grooves in the subsidiary circuit board and by soldering. An end of the terminal pins is attached to the main circuit board by soldering, to combine the main and subsidiary circuit boards with one another by the terminal pins.

Furthermore, the subsidiary circuit board is connected with the main capacitor, to constitute a main capacitor unit together therewith. The main capacitor unit is connected with the main circuit board, to constitute the flash device together therewith.

According to an additional aspect of the invention, a light measuring device for automatic flash control is provided. A photometric element measures reflected flash light. A photometric element cover covers the photometric element. An entrance opening is formed in the photometric element cover, for introducing the flash light to the photometric element. A light reducing filter is incorporated in the photometric element cover, disposed between the photometric element and the entrance opening, for reducing the flash light traveling to the photometric element.

Consequently, the dual board structure is provided in the flash device, the lens-fitted photo film unit and the camera. The circuit elements can be disposed in an economized space, and can have compatibility between plural types of flash built-in optical instruments.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENT(S) OF THE PRESENT INVENTION

Figure 1:
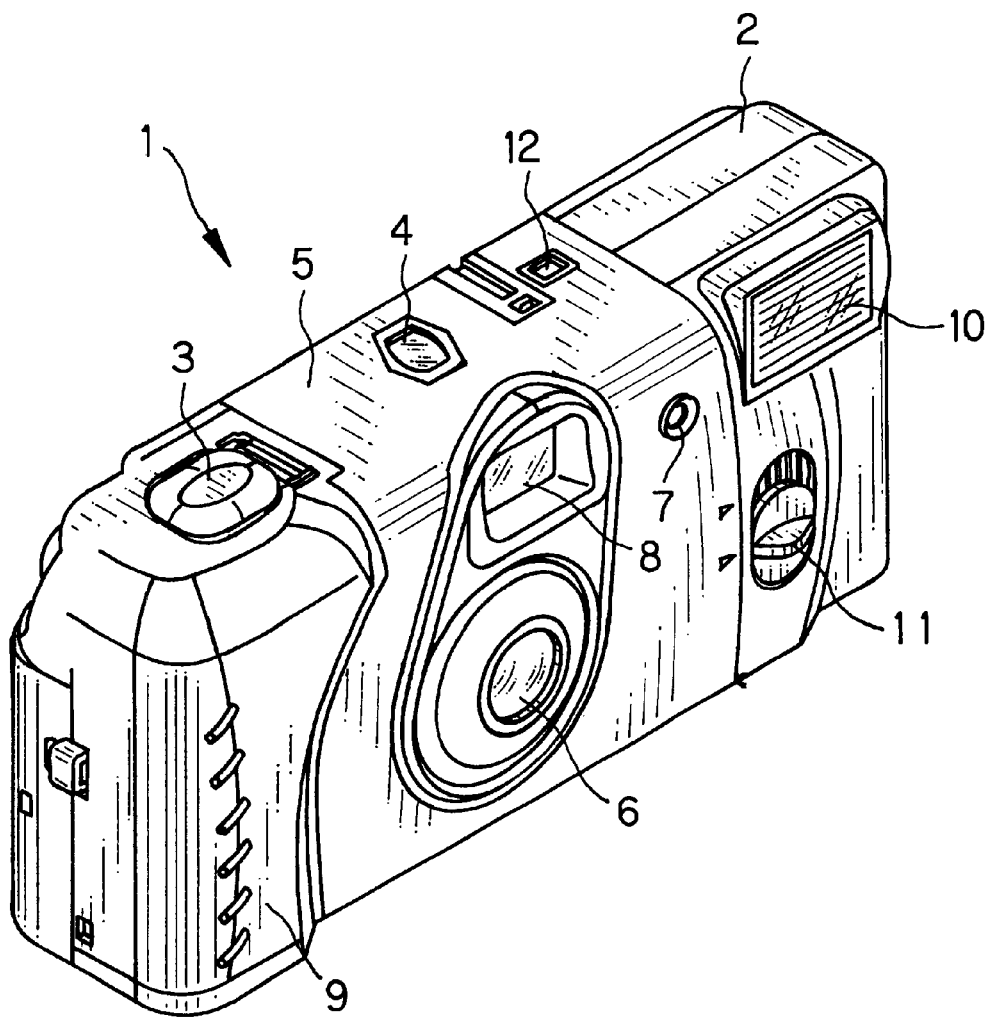
FIG. 1 is a perspective illustrating a lens-fitted photo film unit of the invention.

In FIG. 1, a lens-fitted photo film unit 1 has a housing 2 basically formed from plastic material. In an upper face of the housing 2, there are a shutter release button 3 and a frame counter window 4, where the number of remaining available frames is indicated. A packaging belt 5 is wound on the outside of the housing 2. A taking lens 6 appears in a front face of the housing 2. There is a photometric window 7, behind which a photometric element is disposed for detecting reflected flash light from a photographic field. A viewfinder objective window 8 is disposed higher than the taking lens 6, and has a viewfinder objective lens. A grip 9 is formed in the housing 2, and includes patterned projections for preventing slipping. A flash emitter 10 is incorporated for emitting flash light.

A charger button 11 is slidable up and down, and when slid up, causes a start of charging the flash device. Upon completion of the charging, a light-emitting diode (LED) is driven to illuminate behind a flash standby indicator 12, where a state ready for flash emission can be checked. Upon completion of the flash charging, the shutter device is actuated by depressing the shutter release button 3. The flash emitter 10 is simultaneously driven to illuminate for taking an exposure with flash light.

The lens-fitted photo film unit 1, which will be described later in detail, is provided with a structure for measuring reflected flash light incident upon the photometric window 7 at the time of flash photography. If a user intends photography of an object at a near distance, an amount of flash light is automatically controlled to prevent an overexposed state of the principal object with whitish appearance due to extreme intensity of the reflected flash light.

Figure 2:
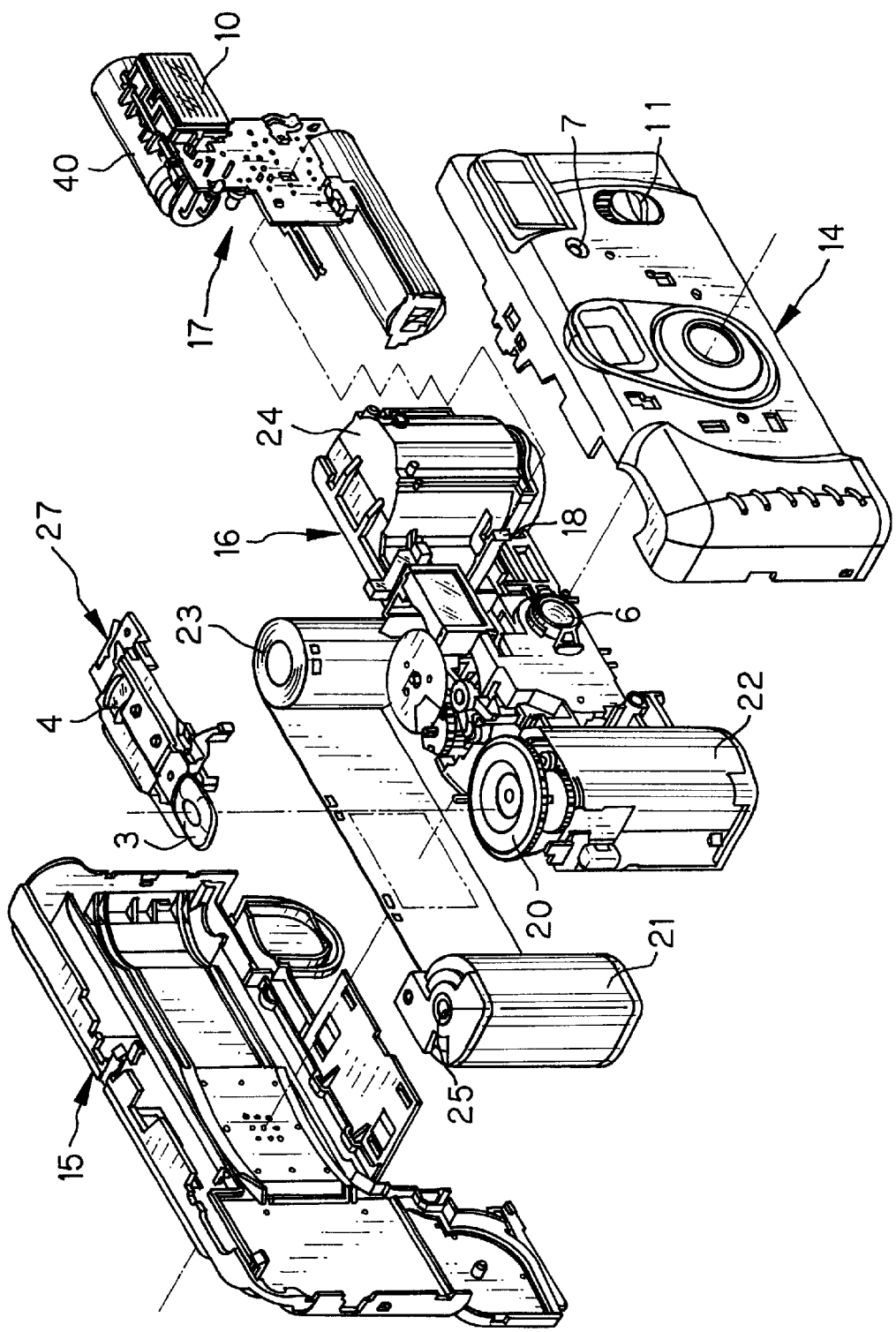
FIG. 2 is an exploded perspective illustrating the lens-fitted photo film unit.
Figure 3:
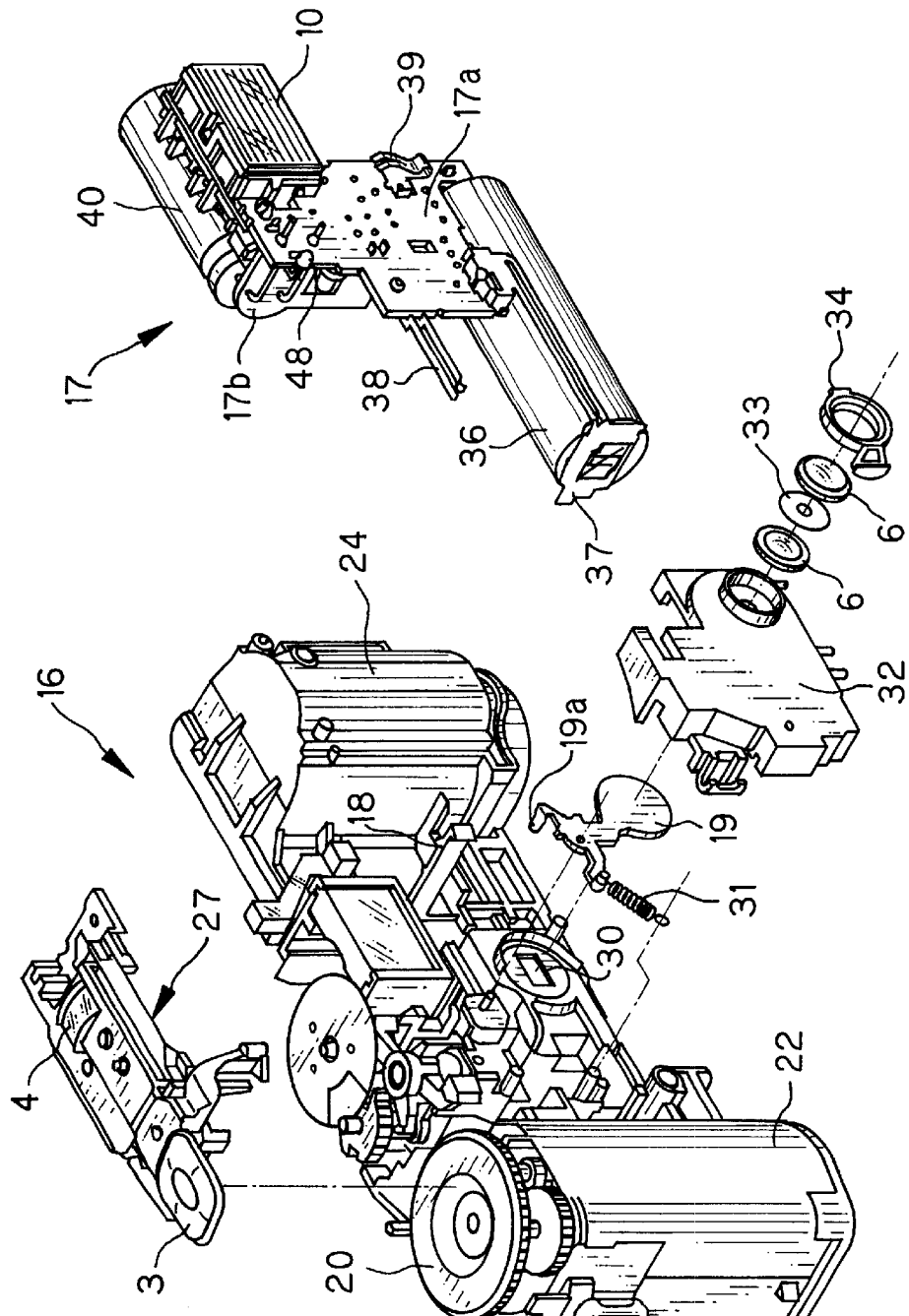
FIG. 3 is an exploded perspective illustrating a main body, a flash device and other elements in the lens-fitted photo film unit.

In FIG. 2, the lens-fitted photo film unit 1 includes a main body 16, a front cover 14 and a rear cover 15. The front cover 14 and the rear cover 15 cover the front and rear of the main body 16. A flash device 17 includes a main circuit board and a main circuit element group mounted on the main circuit board. A fastening projection 18 is formed to project from the main body 16, and fastens the flash device 17 on the main body 16 behind the front cover 14. The taking lens 6 is supported on the center of the main body 16. The main body 16 includes a shutter device, a shutter charging mechanism and a one-frame winding mechanism. The shutter device well-known in the art has a shutter blade 19 disposed behind the taking lens 6 as depicted in FIG. 3, for opening/shutting a light path for an exposure upon being knocked. The shutter charging mechanism operates in response to rotation of a winder wheel 20, and charges the shutter device in a manner ready to knock the shutter blade 19. The one-frame winding mechanism feeds the photo film by one frame after the shutter device operates, and blocks rotation of the winder wheel 20.

The main body 16 includes a cassette holder chamber 22 and a photo film chamber 24 formed by molding of the plastic material. The cassette holder chamber 22 is used to contain a photo film cassette 21. The photo film chamber 24 is used to contain a roll of photo film 23 which has been drawn out of the photo film cassette 21 and externally wound in the roll form. A cassette spool 25 in the photo film cassette 21 becomes engaged with a core portion of the winder wheel 20.

A portion of the winder wheel 20 appears in an opening in the rear cover 15. The winder wheel 20, when rotated for each one exposure, causes the photo film to move toward the photo film cassette 21 by one frame. In response to rotation of the winder wheel 20, the shutter device is charged and becomes ready for next exposure.

An upper combination plate 27 is secured to an upper wall of the main body 16. The upper combination plate 27 is constituted by two plate parts, a first of which is opaque and includes the shutter release button 3, and a second of which is transparent and colorless and includes the frame counter window 4.

A photographing opening 30 is formed in a light-shielded tunnel behind the shutter blade 19. In the rear of the light-shielded tunnel is formed an exposure aperture for defining a region of exposure with object light incident through the photographing opening 30. The photo film is exposed at the exposure aperture. A return spring 31 has a first end portion connected with the shutter blade 19, and a second end portion connected with the main body 16. The shutter blade 19 is biased by the return spring 31 toward the closed position to close the photographing opening 30. In front of the shutter blade 19 are disposed a lens holder 32, an aperture stop plate 33, the taking lens 6 and a fastening plate 34.

The flash device 17 includes a main circuit board 17a. A battery contact segment 37 and the flash emitter 10 are fixedly secured to the main circuit board 17a. The battery contact segment 37 supports and contacts a battery 36. A sync switch 38, a charger power switch 39 and a main capacitor 40 are mounted on, or directly connected to, the main circuit board 17a among various circuit elements for the flash circuit. The sync switch 38 is turned on by opening operation of the shutter blade 19. The charger power switch 39 is turned on by a shift of the charger button 11. The main capacitor 40 stores charge at a high voltage.

In the flash emitter 10, a flash discharge tube 41 emits flash light by discharging the main capacitor 40 that has stored charge at the high voltage. See FIG. 6. Also, a reflector is disposed behind the flash discharge tube 41, and reflects the flash light toward a photographic object with suitable efficiency.

Figure 4:
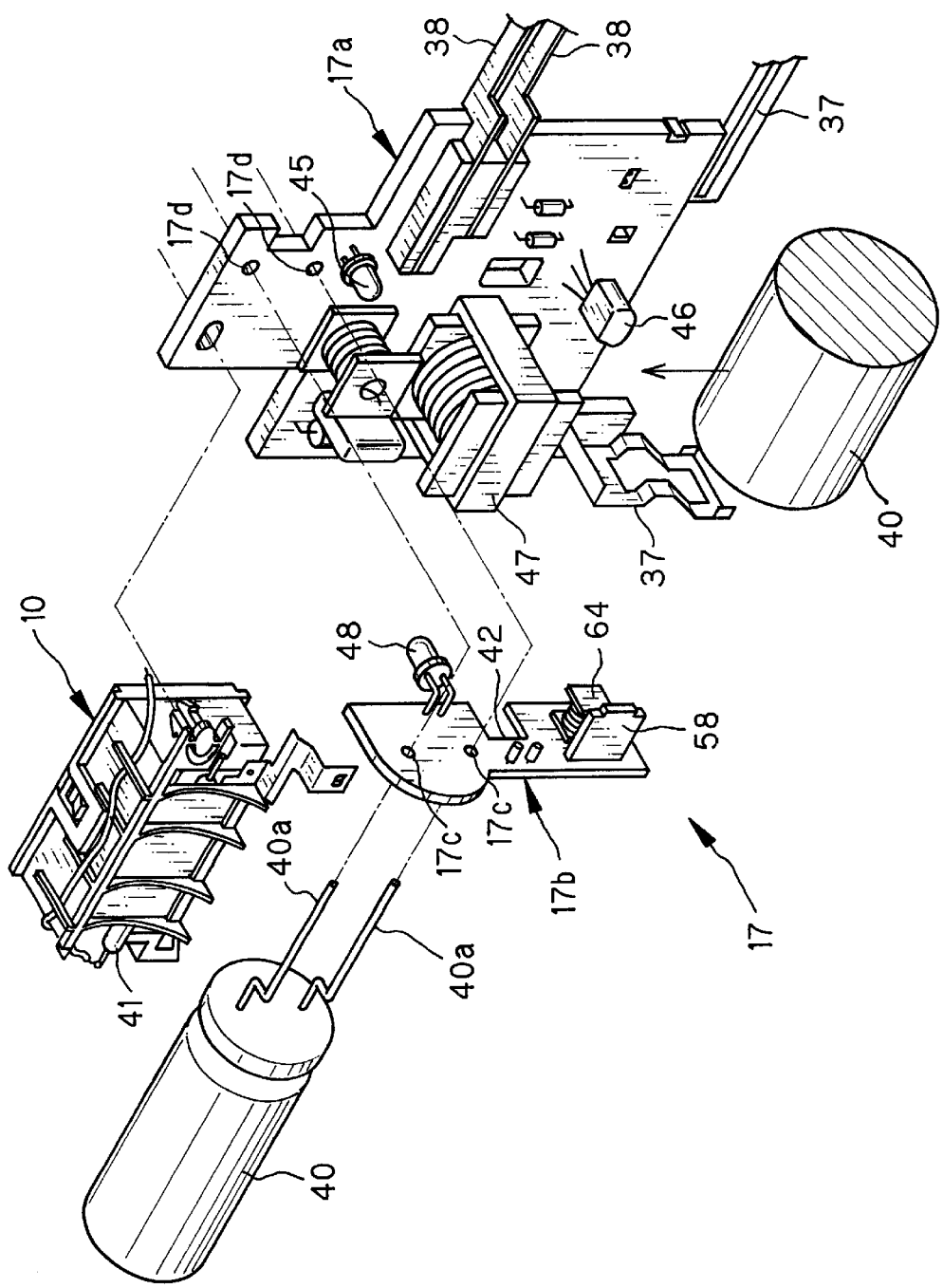
FIG. 4 is an exploded perspective illustrating the main capacitor and main and subsidiary circuit board in the flash device.
Figure 5:
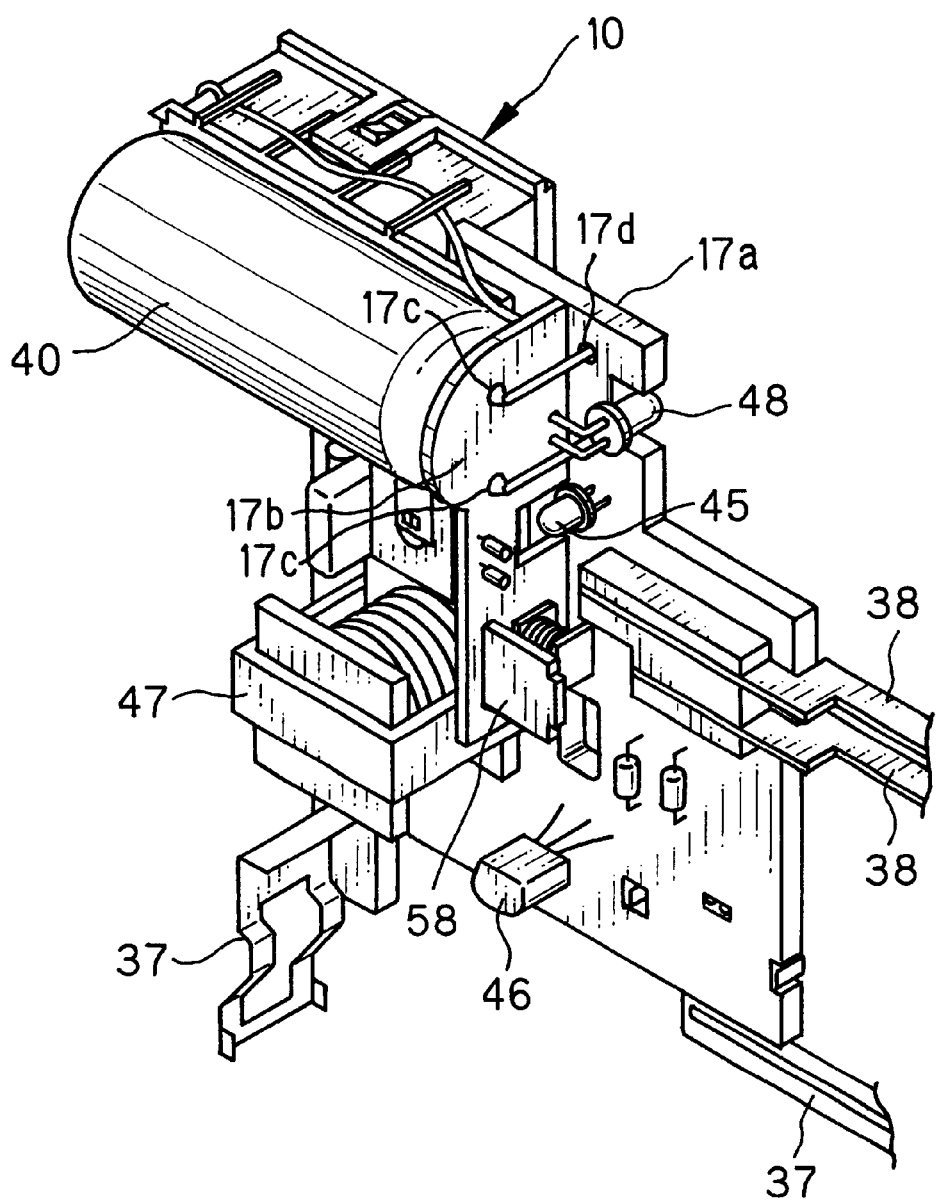
FIG. 5 is a perspective, partially broken, illustrating the flash device as viewed from the rear.

In FIGS. 4 and 5, the flash device 17 includes a subsidiary circuit board 17b in addition to the main circuit board 17a. Capacitor terminal pins 40a of the main capacitor 40 are inserted in holes 17c of the subsidiary circuit board 17b, and are fixed and connected with the subsidiary circuit board 17b by soldering at points 17d. In the fixation of the capacitor terminal pins 40a, the subsidiary circuit board 17b is kept oriented perpendicularly to the main circuit board 17a in a rear space. A cutout 42 is formed in the subsidiary circuit board 17b, and prevents the subsidiary circuit board 17b from contacting circuit elements in the main circuit board 17a. The main circuit board 17a is equipped also with an LED (light-emitting diode) 45, an oscillation transistor 46, and an oscillation transformer 47 mounted thereon. The LED 45 is driven to emit light upon completion of charging the flash device. The oscillation transistor 46 and the oscillation transformer 47 are combined as a booster circuit, and effect oscillation of pulses at a high voltage.

Figure 6:
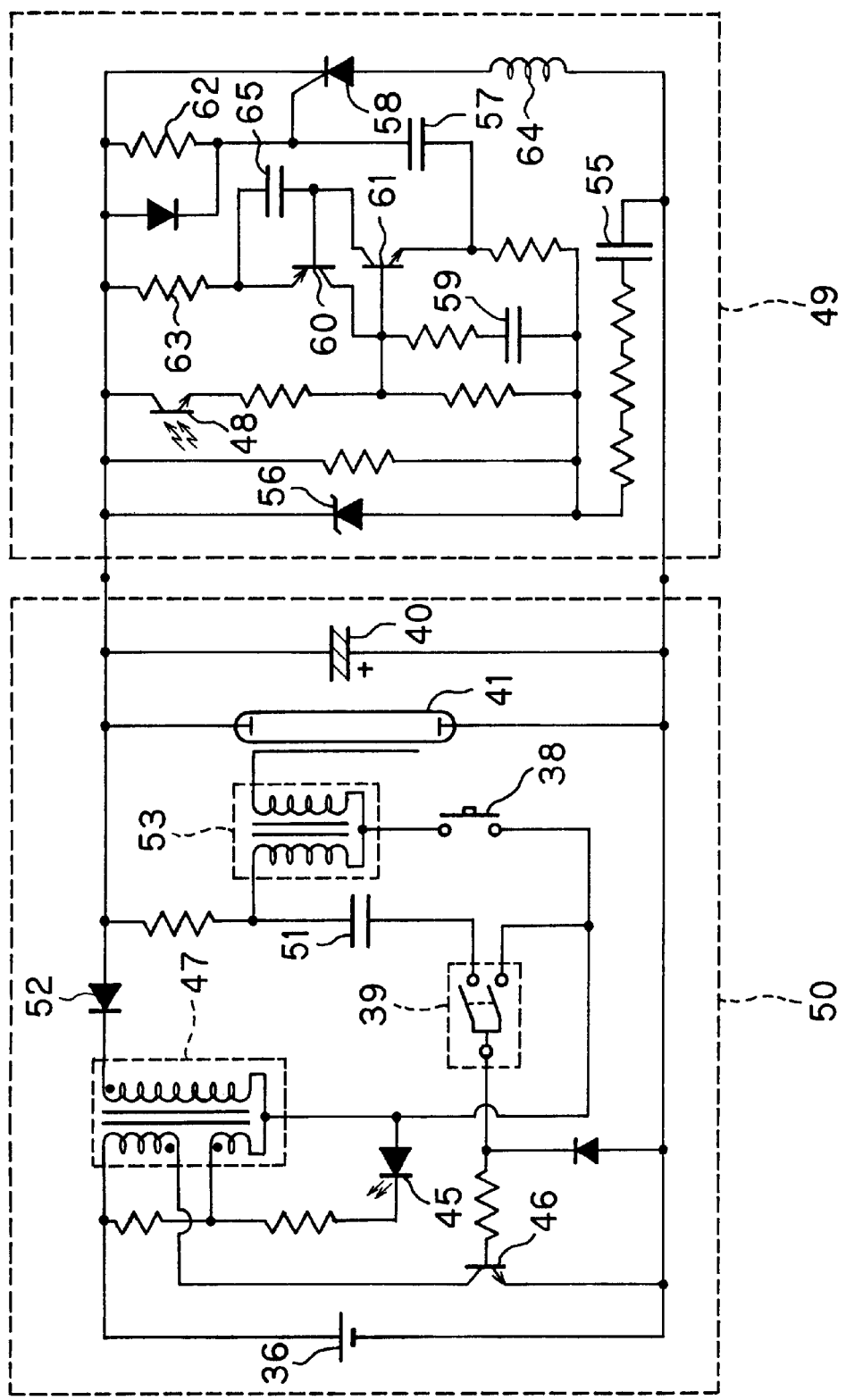
FIG. 6 is a block diagram illustrating circuits included in the flash device.

FIG. 6 illustrates the subsidiary circuit board 17b. On the subsidiary circuit board 17b are mounted a photo transistor 48 as photometric element, and a flash quenching circuit or light adjusting circuit 49. As the capacitor terminal pins 40a of the main capacitor 40 are connected to the subsidiary circuit board 17b by soldering, the flash quenching circuit 49 becomes connected electrically in parallel with the main capacitor 40 and the flash discharge tube 41 on the side of the main circuit board 17a.

A main circuit element group 50 in the main circuit board 17a is supplied with power by the battery 36. The booster circuit or blocking oscillator, which is constituted by the oscillation transistor 46 and the oscillation transformer 47, causes the main circuit element group 50 to charge the main capacitor 40 and a trigger capacitor 51 at a high voltage of approximately 300 volts. A rectification diode 52 is connected between the oscillation transformer 47 and each of the main capacitor 40 and the trigger capacitor 51, for preventing a current to flow in reverse to a predetermined direction of the current of charging.

When the charger button 11 is slid up, the charger power switch 39 is turned on to start charging. When the changing is completed, the LED 45 emits light, and can be checked through the charger button 11. The charger power switch 39 starts operation of the blocking oscillator, and prevents the discharge of the trigger capacitor 51 at the time except for the time of turning on of the switch.

Figure 7A:
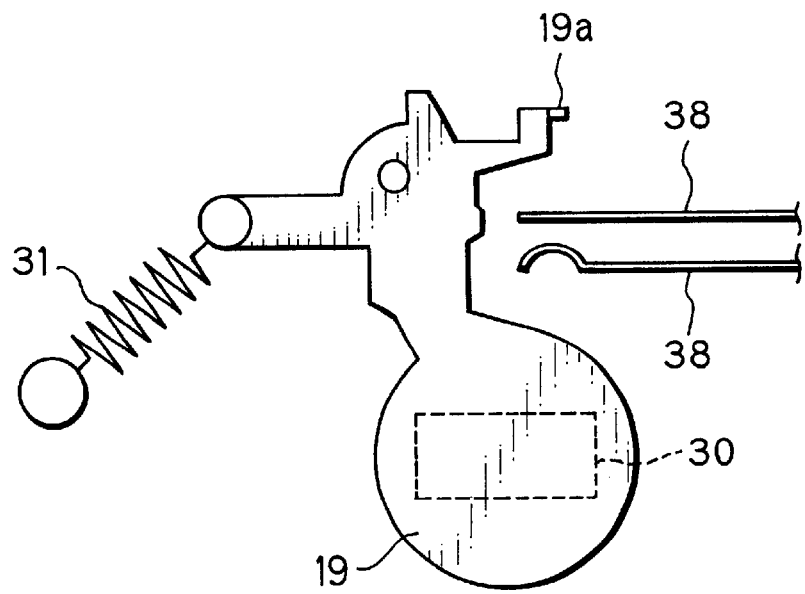
FIG. 7A is an explanatory view in elevation, illustrating a sync switch in the flash device and a shutter blade in a shut state.
Figure 7B:
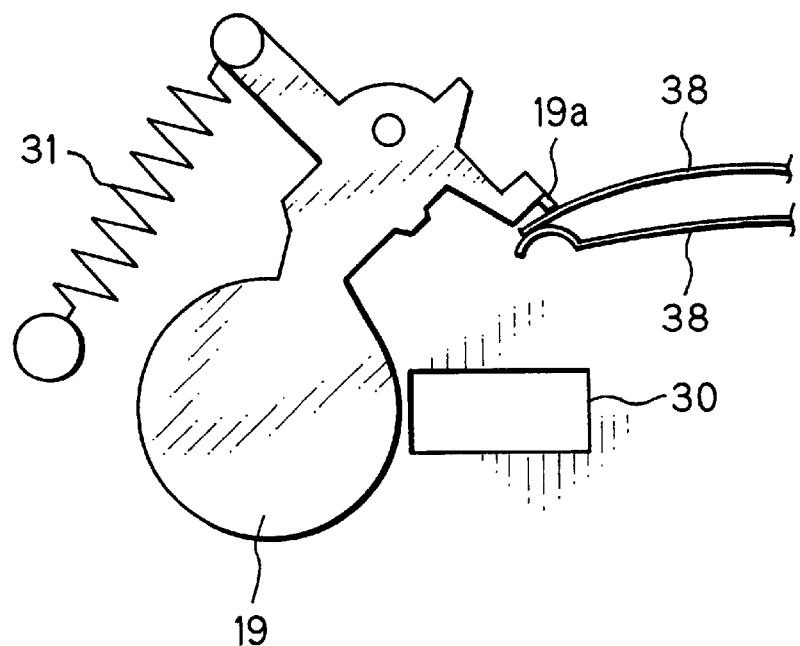
FIG. 7B is an explanatory view in elevation, illustrating the sync switch and the shutter blade in the open state.

After the main capacitor 40 and the trigger capacitor 51 are charged, the use of flash light is enabled if the charger power switch 39 is kept turned on. The shutter release button 3 is depressed to actuate the shutter blade 19. In FIG. 7, a blade projection 19a of the shutter blade 19 is swung together with the shutter blade 19, and contacts and turn on the sync switch 38. In response to this, the trigger capacitor 51 is discharged. A trigger transformer 53 in the trigger circuit is supplied with a current from the trigger capacitor 51, to generate a breakdown voltage at a high level. Discharge of the flash discharge tube 41 is triggered. Then the charge stored in the main capacitor 40 is caused to flow in the flash discharge tube 41, to emit flash light. As a result, the main circuit element group 50 operates in the flash device for flash light of a predetermined intensity if without particular additional circuit elements.

A power supply capacitor 55 is included in the flash quenching circuit 49, and stores charge for powering circuit elements in the flash quenching circuit 49. The main circuit element group 50 also operates to charge the power supply capacitor 55 at the same time as charging of the main capacitor 40 and the trigger capacitor 51. There is a Zener diode 56, in which a current of charging the power supply capacitor 55 flows.

Upon the discharge in the flash discharge tube 41, a gate capacitor 57 is charged according to the flow of charge in the flash discharge tube 41 from the power supply capacitor 55. There is an SCR (silicon controlled rectifier) 58 as tripolar thyristor having a gate terminal, with which the gate capacitor 57 is connected. When the power supply capacitor 55 is discharged, there occurs a potential difference between the emitter and collector of the photo transistor 48. Then reflected flash light is detected by the photo transistor 48, so that a photoelectric current flows according to a detected amount of the light. An integration capacitor 59 is charged by the photoelectric current.

When the integration capacitor 59 is charged up to a predetermined voltage level, then latch transistors 60 and 61 become conductive. Thus, the gate capacitor 57 is discharged. A current from the same flows through a resistor 62. A gate/trigger voltage, which corresponds to a drop in the voltage across the resistor 62, is input to the SCR 58, which is rendered conductive.

When the SCR 58 is rendered conductive, the flow of the current caused by the discharge of the main capacitor 40 is changed over from the flash discharge tube 41 to the SCR 58. At the same time as the change over, the flash emission is quenched. The remainder of the charge stored in the main capacitor 40 comes to flow in the SCR 58. A choke coil 64 allows a current from the main capacitor 40 being discharged to flow at a low frequency to the SCR 58, and protects the SCR 58 from a current at a high frequency and prevents an overcurrent from flowing to the SCR 58. An auxiliary capacitor 65 prevents the latch transistors 60 and 61 from operating with errors even upon occurrence of electric noises.

The flash quenching circuit 49 is mounted on the subsidiary circuit board 17b. The main circuit element group 50 on the main circuit board 17a, therefore, acts as a flash device with an automatic light adjustment of a bypass type according to the connection of the flash quenching circuit 49 with the main capacitor 40.

As the various circuit elements are mounted on the main circuit board 17a and on the subsidiary circuit board 17b in a separate manner, it is possible selectively to produce flash devices of an automatic light adjusting type and of a regular flash emitting type. At first, the main circuit board 17a with the flash circuit elements but without the main capacitor 40 is prepared. Also, the subsidiary circuit board 17b with the flash quenching circuit is prepared. If the regular flash emitting type of the flash device is intended in the manufacturing process, the main capacitor 40 can be connected only to the main circuit board 17a. If the automatic light adjusting type of the flash device is intended in the manufacturing process, the main capacitor 40 can be connected to the subsidiary circuit board 17b before being connected to the main circuit board 17a.

Accordingly, it is possible to change the flash device 17 from the automatic adjustable type to the regular flash emitting type only by attaching and detaching the subsidiary circuit board 17b with the main capacitor 40. In other words, a flash device of the regular flash emitting type may be provided additionally with an automatic adjustable structure. In conclusion, the construction of the invention is effective in utilization of common electrical parts according to general-purpose structures between different types of products including the automatic adjustable type and the regular flash emitting type in contrast to the prior art.

The lens-fitted photo film unit, after being used, is withdrawn in a collective manner by the manufacturer. The lens-fitted photo film unit has a form in which the photo film cassette and photo film have been removed. In a factory of the manufacturer, the product is checked, repaired and renewed. After being inspected in a suitable manner, the product is shipped to the market. This is a recycling process of the lens-fitted photo film unit. In considering this situation, the above-described separate structure of the main circuit board 17a and the subsidiary circuit board 17b is effective in reducing the number of the steps of exchanging parts of the product. Lens-fitted photo film units can be recycled and shipped only at a short period.

Note that the flash device of the invention may be incorporated in a compact camera. A charger button is disposed on a camera outer wall to turn on and off a charger power switch easily. Also, a trigger circuit is energized to emit flash light at the same time as actuation of the shutter device.

Figure 8:
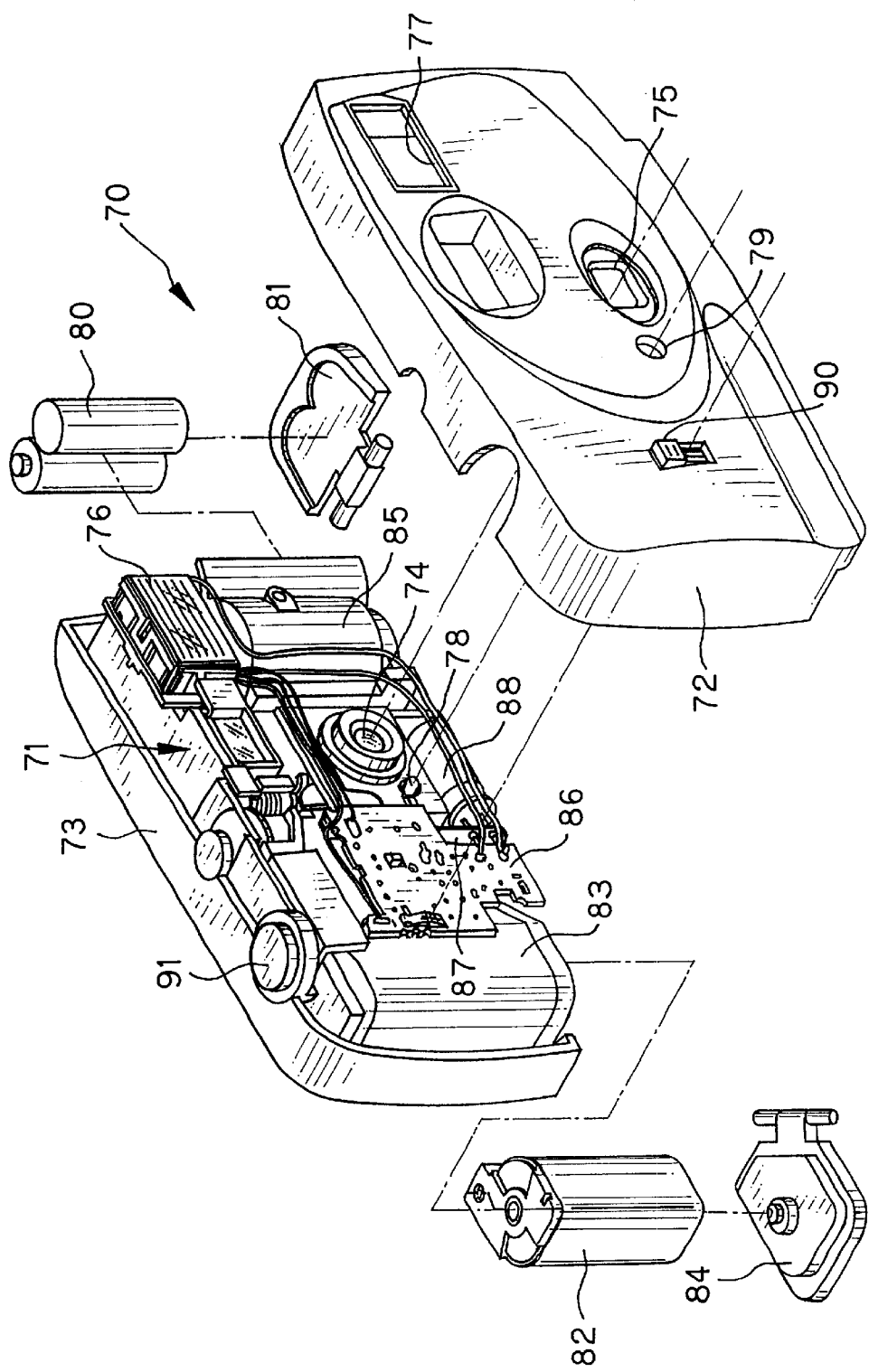
FIG. 8 is an exploded perspective illustrating a camera of the invention.

In FIG. 8, a compact camera 70 of the invention is illustrated, in which the photo film cassette is loadable and removable. The compact camera 70 includes a main body 71, a front cover 72 and a rear cover 73. The front cover 72 includes a lens opening 75, a flash window 77 and a photometric window 79. A taking lens 74 appears in the lens opening 75. A flash emitter 76 appears in the flash window 77. A photo transistor 78 as photometric element is disposed behind the photometric window 79, and measures reflected flash light. A battery chamber is formed in a side portion of the main body 71, and is loadable with batteries 80. A battery chamber lid 81 is disposed on a lower side of the camera, and openably closes the battery chamber. A cassette holder chamber 83 is also formed in the main body 71, and is loaded with a photo film cassette 82. A cassette chamber lid 84 openably closes the cassette holder chamber 83, and keeps the photo film cassette 82 positioned when locked at the cassette holder chamber 83. There is a photo film chamber 85, into which the photo film is fed by one frame each time after an exposure is taken.

Figure 9:
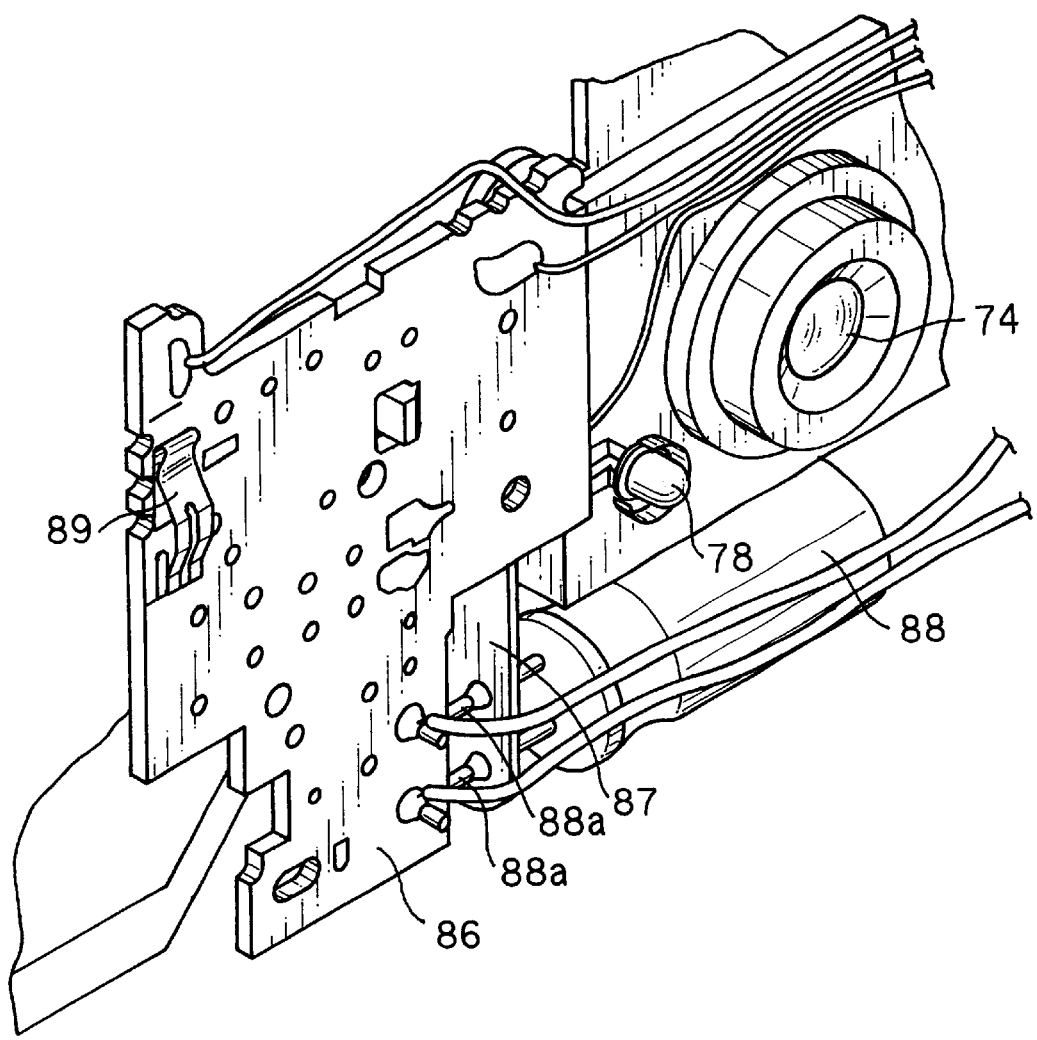
FIG. 9 is a perspective illustrating a main capacitor and main and subsidiary circuit boards in the camera.

In FIG. 9, a main circuit board 86 and a subsidiary circuit board 87 are disposed between the main body 71 and the front cover 72. The main circuit board 86 is not provided with the flash emitter 10, the battery contact segment 37 and the sync switch 38 with which the main circuit board 17a is provided in FIG. 4. However, the other various elements included in the main circuit board 86 are the same as those of the main circuit board 17a. A main capacitor 88 is fixedly connected with the main circuit board 86, and disposed under the taking lens 74. Capacitor terminal pins 88a of the main capacitor 88 are inserted through and connected with the subsidiary circuit board 87. The subsidiary circuit board 87 is fastened by soldering to the capacitor terminal pins 88a, and kept substantially perpendicular to the main circuit board 86. On the subsidiary circuit board 87 is mounted the flash quenching circuit 49 the same as that in the first embodiment.

A plurality of jumper wires are connected with the main circuit board 86 by soldering. The jumper wires are used to connect the capacitor terminal pins 88a of the main capacitor 88 to the flash discharge tube in the flash emitter 76, and to connect some of the flash circuit elements to the batteries 80 by extending to the battery chamber.

A charger button 90 is disposed in the front cover 72. A charger power switch 89 is turned on when the charger button 90 is slid down. The charger button 90 is slidable up and down in the front cover 72. The charger power switch 89 being turned on, the flash device starts being charged. After charging, the charger button 90 is kept slid down, to stand by for an exposure with flash. When a shutter release button 91 is depressed, a shutter blade is actuated behind the taking lens 74. The compact camera 70 includes a shutter device of a knocking type similar to the lens-fitted photo film unit 1. When the shutter blade opens fully, a pair of sync switch segments (not shown) contacts each other in the main body 71, to send a sync signal to the trigger circuit on the main circuit board 86. The trigger circuit generates breakdown voltage at a high level, which excites the flash discharge tube and causes emission of flash light. When flash light is emitted, the photo transistor 78 measures reflected flash light. When an integration amount of the reflected light comes up to a predetermined level, flash emission is quenched. Thus, the flash light used in taking an exposure is optimized.

In the above embodiment, the auto flash device controls the flash light amount automatically. However, it is possible to mount a photometric circuit on the subsidiary circuit board 17b, in which a photometric element measures object brightness, to effect the exposure control by changing over the stop or exposure amount.

Figure 10:
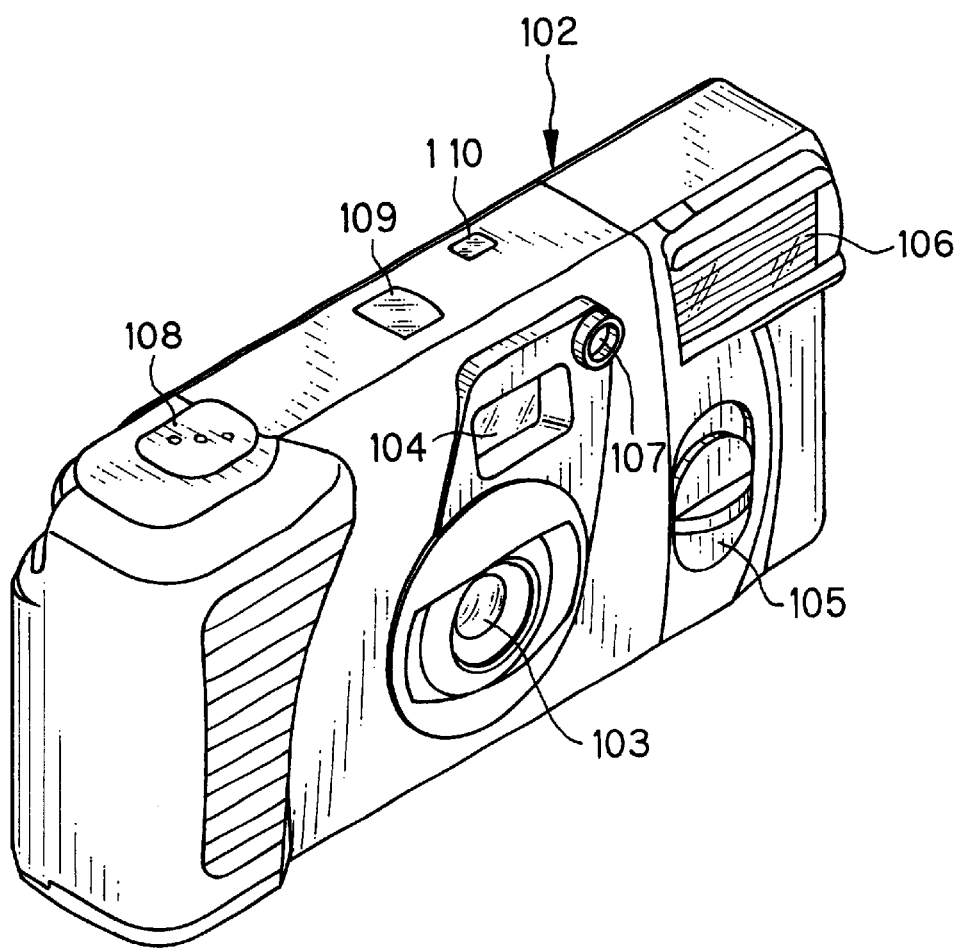
FIG. 10 is a perspective illustrating another preferred lens-fitted photo film unit.

Another preferred embodiment is described with reference to FIGS. 10–18, in which a main capacitor is mounted on a subsidiary circuit board. In FIG. 10, a front side of a lens-fitted photo film unit 102 has a taking lens 103, a viewfinder objective window 104, a charger button 105, a flash emitter 106 and a photometric window 107. An upper side of the lens-fitted photo film unit 102 has a shutter release button 108, a frame counter window 109 and a light guide 110. The light guide 110 is movable, and when the charger button 105 is slid up to the charging position, comes to protrude over the upper side.

Figure 11:
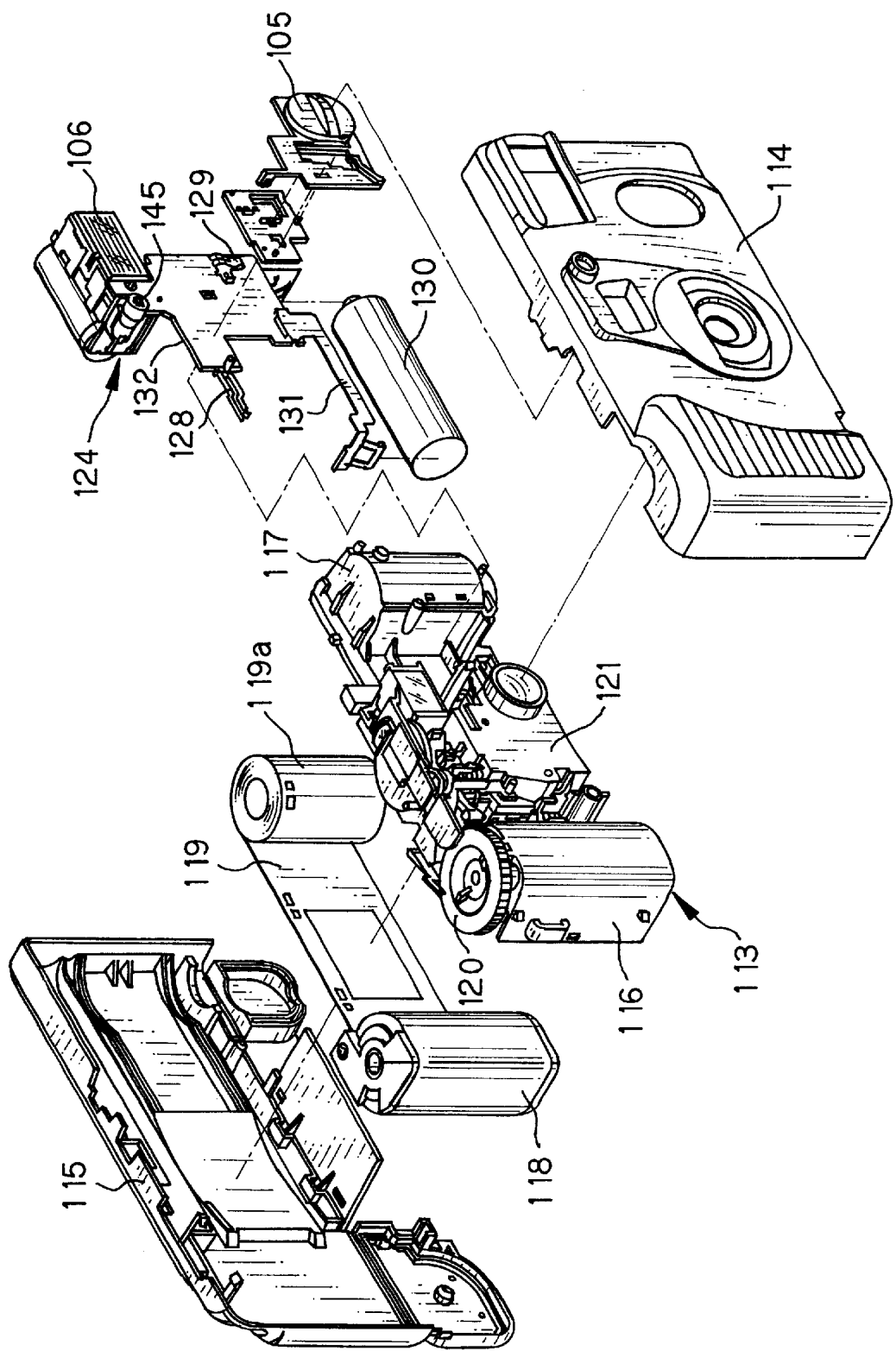
FIG. 11 is an exploded perspective illustrating the lens-fitted photo film unit of FIG. 10.

In FIG. 11, a winder wheel 120 is disposed on an upper wall of a cassette holder chamber 116. A photo film cassette 118 has a cassette spool, with which a lower core portion of the winder wheel 120 is engaged. When the winder wheel 120 is rotated in the counterclockwise direction, an exposed portion of photo film 119 is wound to the inside of the photo film cassette 118.

An exposure opening is formed in the front of a light-shielded tunnel. The shutter blade and a lens holder 121 are disposed in front of the exposure opening.

Figure 12:
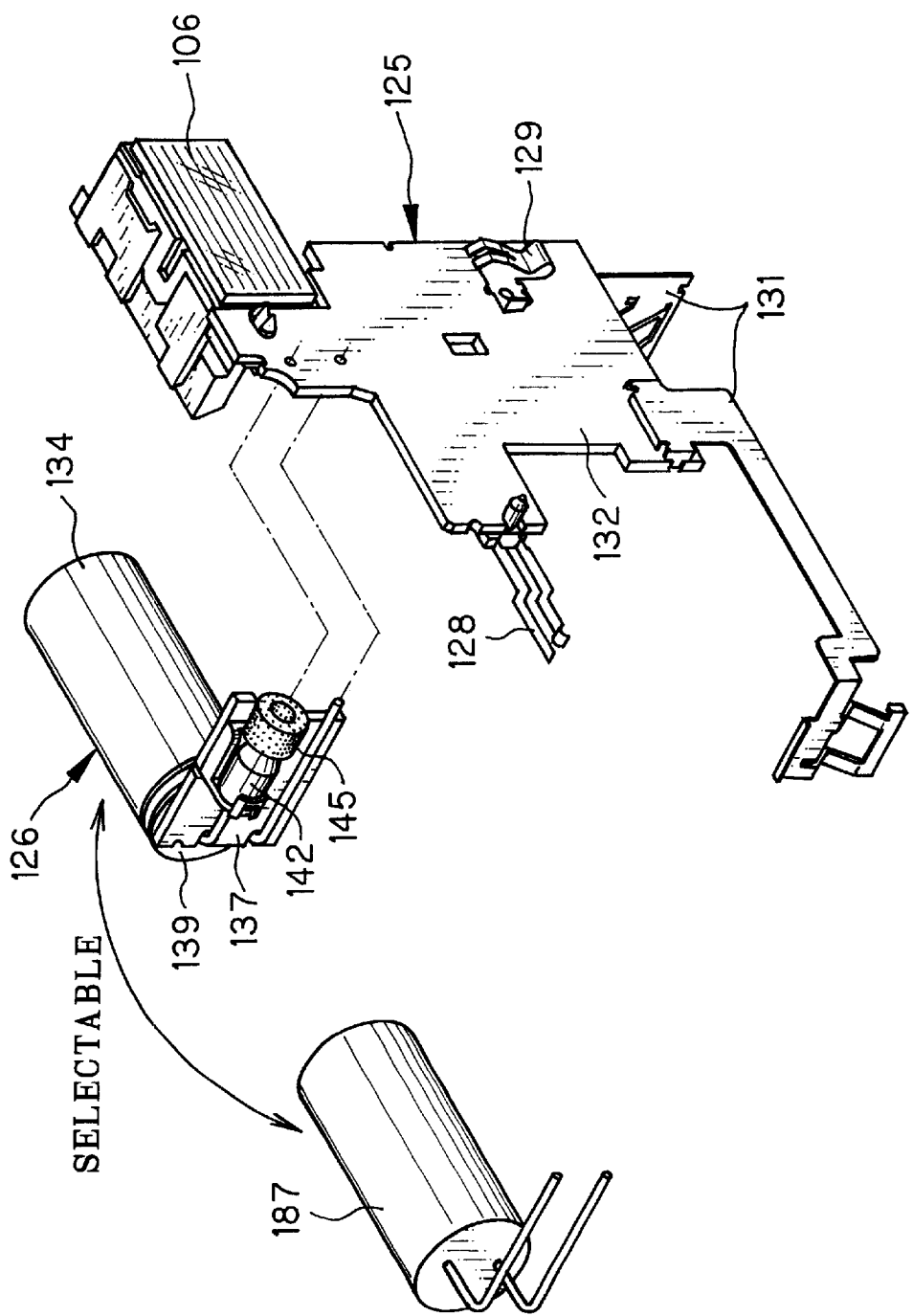
FIG. 12 is an exploded perspective illustrating a flash device together with an alternative main capacitor.

A main body 113 has the light-shielded tunnel. A flash device 124 is fixedly secured to a position between a photo film chamber 117 and the light-shielded tunnel by use of engagement of claws. In FIG. 12, the flash device 124 includes a flash device body 125 and a main capacitor unit 126. The flash device body 125 includes a main circuit board 132, which is provided with the flash emitter 106, a sync switch 128, a charger power switch 129 and a battery contact segments 131 all mounted thereon. The charger power switch 129 turns on and off operation of charging the flash device in sliding of the charger button 105. A battery 130 supplies power in connection with the battery contact segments 131.

Figure 13:
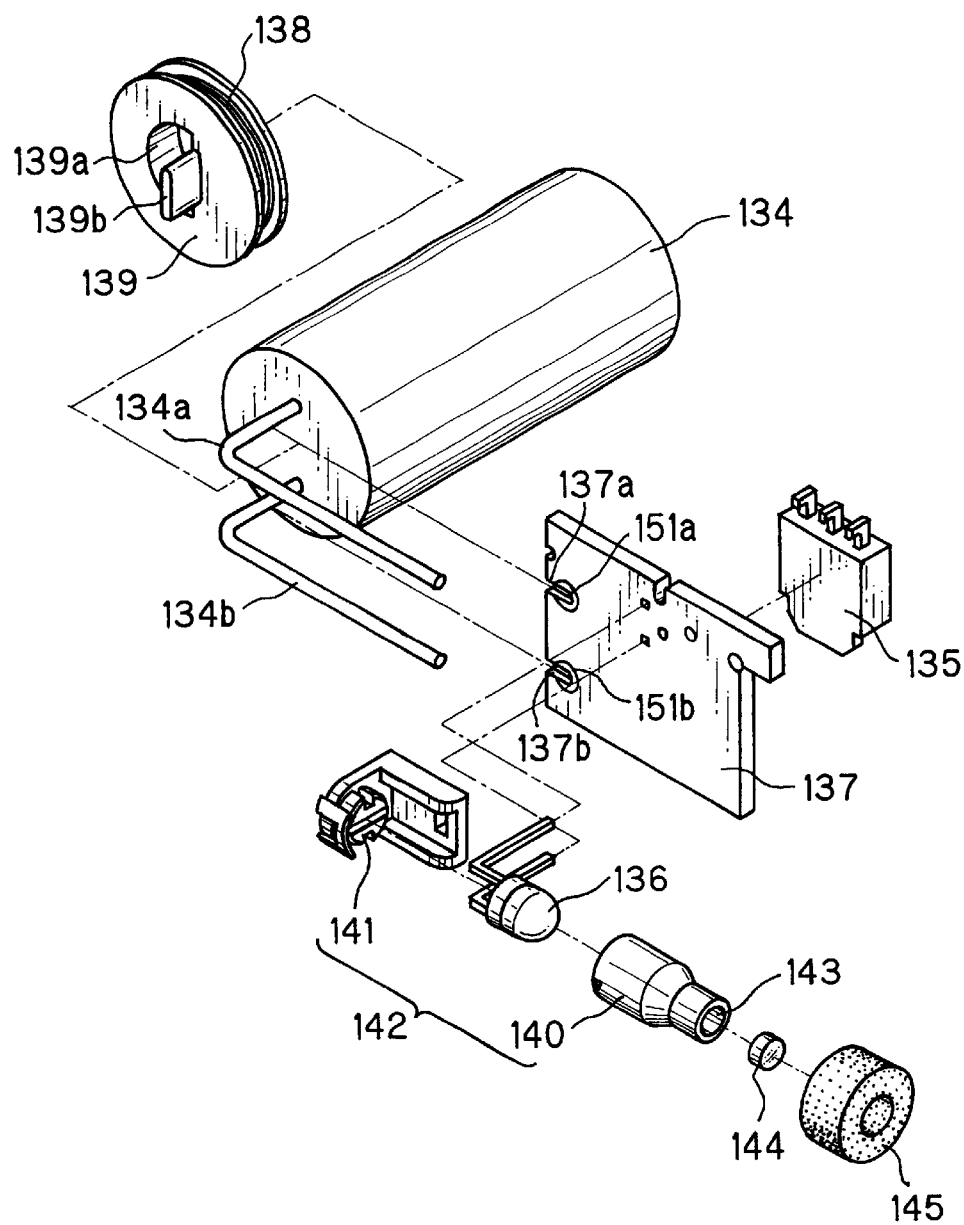
FIG. 13 is an exploded perspective illustrating the main capacitor, the subsidiary circuit board and a bobbin in the flash device.

In FIG. 13, the main capacitor unit 126 includes a main capacitor 134 and a subsidiary circuit board 137, on which there are mounted a thyristor 135 and a photo transistor 136 as photometric element. A bobbin 139 is secured fixedly to the main capacitor 134. A choke coil 138 is wound about the bobbin 139. The photo transistor 136 receives and measures object light. A photometric element cover 142 covers the photo transistor 136, and is constituted by a front cover half 140 and a rear cover half 141. An entrance opening 143 is formed in the front cover half 140. The photo transistor 136 measures reflected flash light entered through the entrance opening 143. A light reducing filter 144 is inserted in the entrance opening 143, and consists of an ND filter for reduction of light. The light reducing filter 144 has a transmittance of a level suitable for a level of a light amount of the flash light. A light-shielding member 145 is secured to the vicinity of the entrance opening 143 of the front cover half 140, and prevents the reflected flash light from entry into the lens-fitted photo film unit 102 as a leaked light component.

Figure 14:
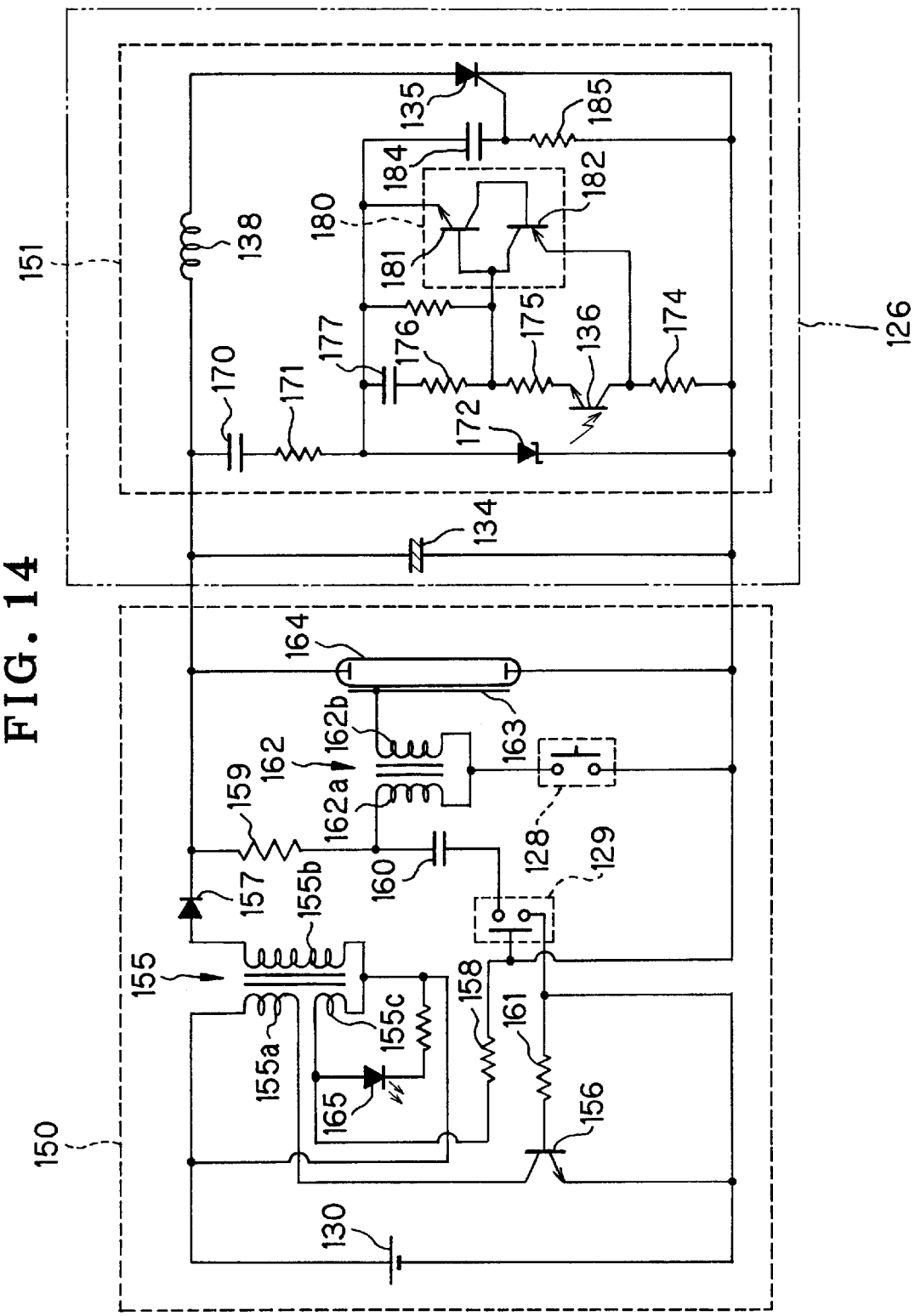
FIG. 14 is a block diagram illustrating circuit in the flash device.

In FIG. 14, there are a flash quenching circuit or light adjusting circuit 151 and a flash circuit 150 or main circuit element group included in the flash device 124. The flash circuit 150 is included in the main circuit board 132. The flash quenching circuit 151 is included in the subsidiary circuit board 137. The flash quenching circuit 151 is connected with the flash circuit 150 by terminal pins of the main capacitor 134.

An oscillation transformer 155 and an oscillation transistor 156 constitute a blocking oscillator, and converts a battery voltage into a high voltage of approximately 300 volts as a booster circuit. The oscillation transformer 155 includes a primary winding 155a, a secondary winding 155b and a tertiary winding 155c, which are coupled with one another in mutual induction. A first end portion of the primary winding 155a is connected with a positive electrode of the battery 130. A second end portion of the primary winding 155a is connected with a collector of the oscillation transistor 156. A first end portion of the secondary winding 155b is connected with an anode of a rectification diode 157. A second end portion of the secondary winding 155b is connected with a positive electrode of the battery 130 together with a first end portion of the tertiary winding 155c. A second end portion of the tertiary winding 155c is connected by a resistor 158 to a terminal of the charger power switch 129.

One terminal of a trigger capacitor 160 in a trigger circuit is connected via a resistor 159 with a cathode of the rectification diode 157. Also, a positive terminal of the main capacitor 134 is connected with the cathode of the rectification diode 157. A second terminal of the trigger capacitor 160 is connected with a terminal of the charger power switch 129. An emitter of the oscillation transistor 156 is connected with a negative electrode of the battery 130. A base of the oscillation transistor 156 is connected by a resistor 161 with a terminal of the charger power switch 129.

The trigger capacitor 160 is charged by a current output by the oscillation transformer 155 in a manner similar to the main capacitor 134. The sync switch 128 is turned on and off in synchronism with opening/shutting operation of the shutter blade. A trigger transformer 162 in the trigger circuit includes a primary winding 162a. When the sync switch 128 is turned on, the trigger capacitor 160 being charged causes a current to flow in the primary winding 162a. In response to this, breakdown voltage occurs in a secondary winding 162b. A trigger electrode 163 applies the breakdown voltage to a flash discharge tube 164. Flash light starts being emitted upon full opening of the shutter blade.

Note that an LED (light-emitting diode) 165 is disposed under the light guide 110. Electrodes of the LED 165 are connected with respectively end portions of the tertiary winding 155c. When the voltage across the main capacitor 134 comes up to a predetermined level for charging, the voltage across the tertiary winding 155c comes over a predetermined level, to turn on the LED 165.

The flash quenching circuit 151 on the subsidiary circuit board 137 is connected in parallel with the flash discharge tube 164, and in parallel with the main capacitor 134. An operation voltage generator circuit is constituted by a combination of a capacitor 170, a resistor 171 and a Zener diode 172. The capacitor 170 is charged by an output current (300 volts) of the oscillation transformer 155 when the main capacitor 134 is charged. Charging of the capacitor 170 is stopped when saturation occurs (400 volts, 0.022 μF). When the main capacitor 134 starts being discharged in a path with the flash discharge tube 164, the capacitor 170 is also discharged in a path with the flash discharge tube 164, the Zener diode 172 and the resistor 171.

The photo transistor 136 has a collector that is connected by a resistor 174 with a cathode of the Zener diode 172. There are resistors 175 and 176 and a capacitor 177 connected in series between an emitter of the photo transistor 136 and an anode of the Zener diode 172. The photo transistor 136 is disposed directly behind the photometric window 107 formed in a front cover 114 of the lens-fitted photo film unit 102, and outputs a photoelectric current according to detected intensity of reflected flash light from a photographic object. The capacitor 177 is charged by a photoelectric current from the photo transistor 136 at a voltage level which increases gradually. In other words, light intensity of the reflected flash light received by the photo transistor 136 is converted to voltage. A photo diode or other illuminating device may be used instead of the photo transistor 136.

A switching unit 180 includes transistors 181 and 182. A base of the transistor 181 is connected with a connection point between the resistors 175 and 176. Also, a collector of the transistor 182 is connected with the same connection point. A collector of the transistor 181 is connected with a base of the transistor 182. An emitter of the transistor 181 is connected with an anode of the Zener diode 172. An emitter of the transistor 182 is connected by the resistor 174 with a cathode of the Zener diode 172. When the voltage across the capacitor 177 comes up to a predetermined level, the transistors 181 and 182 in the switching unit 180 are turned on. The turning on of the switching unit 180 generates a quench signal for quenching emission of flash.

A capacitor 184 and a resistor 185 constitute an on-voltage generating circuit. One terminal of the capacitor 184 is connected with an anode of the Zener diode 172. One end portion of the resistor 185 is connected with a cathode of the Zener diode 172. The capacitor 184 is charged via the resistor 185 by a voltage generated across the Zener diode 172. When the switching unit 180 is turned on, the capacitor 184 is discharged in a path with the resistor 185, the resistor 174 and the switching unit 180. A gate voltage occurs across the resistor 185 for rendering the thyristor 135 conductive.

A gate and cathode of the thyristor 135 are connected to respectively end portions of the resistor 185. An anode and the cathode of the thyristor 135 are connected to respectively terminals of the main capacitor 134. Thus, the voltage across the main capacitor 134 being charged is applied between the anode and cathode of the thyristor 135. Voltage across the resistor 185, which occurs upon discharging the capacitor 184, is applied between the gate and cathode of the thyristor 135.

The operation of the above construction is described. In FIG. 13, the subsidiary circuit board 137 having the flash quenching circuit 151 is prepared, to which the thyristor 135 and the photo transistor 136 are attached by soldering. A hole 139a is formed in the bobbin 139, into which capacitor terminal pins 134a and 134b of the main capacitor 134 are inserted. The capacitor terminal pins 134a and 134b are inserted in cutouts 137a and 137b formed in the subsidiary circuit board 137, for attachment by soldering. Subsidiary board terminals 151a and 151b of the flash quenching circuit 151 are located in the vicinity of the cutouts 137a and 137b of the subsidiary circuit board 137. The capacitor terminal pins 134a and 134b are attached to the subsidiary board terminals 151a and 151b by soldering so as to connect the main capacitor 134 electrically with the flash quenching circuit 151. A projection 139b is formed to project from the bobbin 139, and positions the main capacitor 134 exactly relative to the subsidiary circuit board 137. A first end portion of the choke coil 138 is attached by soldering to the capacitor terminal pin 134a of the main capacitor 134. A second end portion of the choke coil 138 is attached by soldering to a contact point of the subsidiary circuit board 137. The choke coil 138 is in series with an anode of the thyristor 135. As a result, the main capacitor unit 126 is obtained.

In FIG. 12, the main capacitor unit 126 is secured to a predetermined position of the main circuit board 132 where the flash emitter 106, the sync switch 128 and the battery contact segments 131 are mounted. The subsidiary circuit board 137 is approximately perpendicular to the main circuit board 132. The capacitor terminal pins 134a and 134b of the main capacitor 134 are attached by soldering to electrodes of the flash discharge tube 164 for parallel connection, in a suitable position of the flash circuit 150 on the main circuit board 132. So the flash quenching circuit 151 is connected with the flash circuit 150. Then an amount of reflected flash light is experimentally measured. The light reducing filter 144 of a type with transmittance according to the measured light amount is inserted in the entrance opening 143 of the front cover half 140. Now the flash device 124 is constructed as a product. The flash device 124 being obtained finally is secured to the main body 113 of the lens-fitted photo film unit 102, to which the front cover 114 is attached. Then the photo film cassette 118 and a photo film roll 119a being unexposed are inserted in respectively the cassette holder chamber 116 and the photo film chamber 117. A rear cover 115 is secured suitably.

In FIG. 12, the exchange of the main capacitor is illustrated. To construct a flash device without an automatic light adjustment, an alternative main capacitor 187 is attached instead of the main capacitor unit 126. Terminal pins of the main capacitor 187 are attached to contact points the same as those to which the capacitor terminal pins 134a and 134b of the main capacitor 134 are attached. The use of the main capacitor 187 makes it possible to construct the conventional type of flash device. The flash device body 125 is compatible for the two types, one with the main capacitor unit 126 and another with the main capacitor 187.

Figure 15:
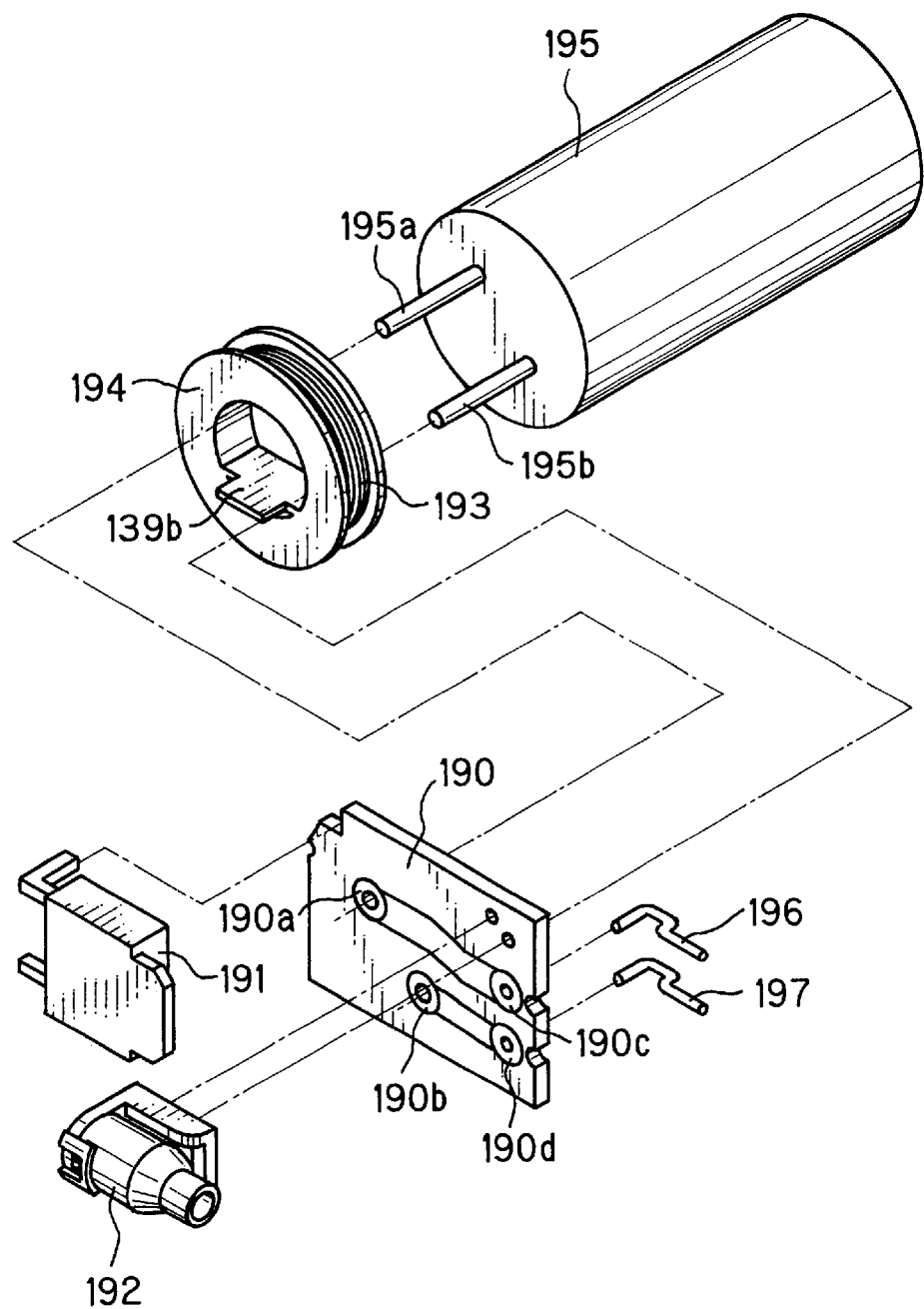
FIG. 15 is an exploded perspective illustrating another subsidiary circuit board with terminal patterns, together with the main capacitor and the bobbin.

Still another preferred embodiment is described, in which subsidiary board terminal patterns 190a and 190b are utilized for connecting the flash quenching circuit with the flash circuit. In FIG. 15, a subsidiary circuit board 190 has two surfaces on which a flash quenching circuit or light adjusting circuit is formed. A thyristor 191 and a light measuring device 192 with a photometric element are attached to the subsidiary circuit board 190 by soldering. A choke coil 193 is wound about a bobbin 194, which is secured to a main capacitor 195. Capacitor terminal pins 195a and 195b protrude from the main capacitor 195, and are attached to respectively the subsidiary board terminal patterns 190a and 190b of the subsidiary circuit board 190. There are connection terminals 196 and 197 which are connected with the subsidiary board terminal patterns 190a and 190b at contact points 190c and 190d. As the connection terminals 196 and 197 are disposed in the flash device body, it is possible to provide automatic light adjustment in the flash device.

Figure 16:
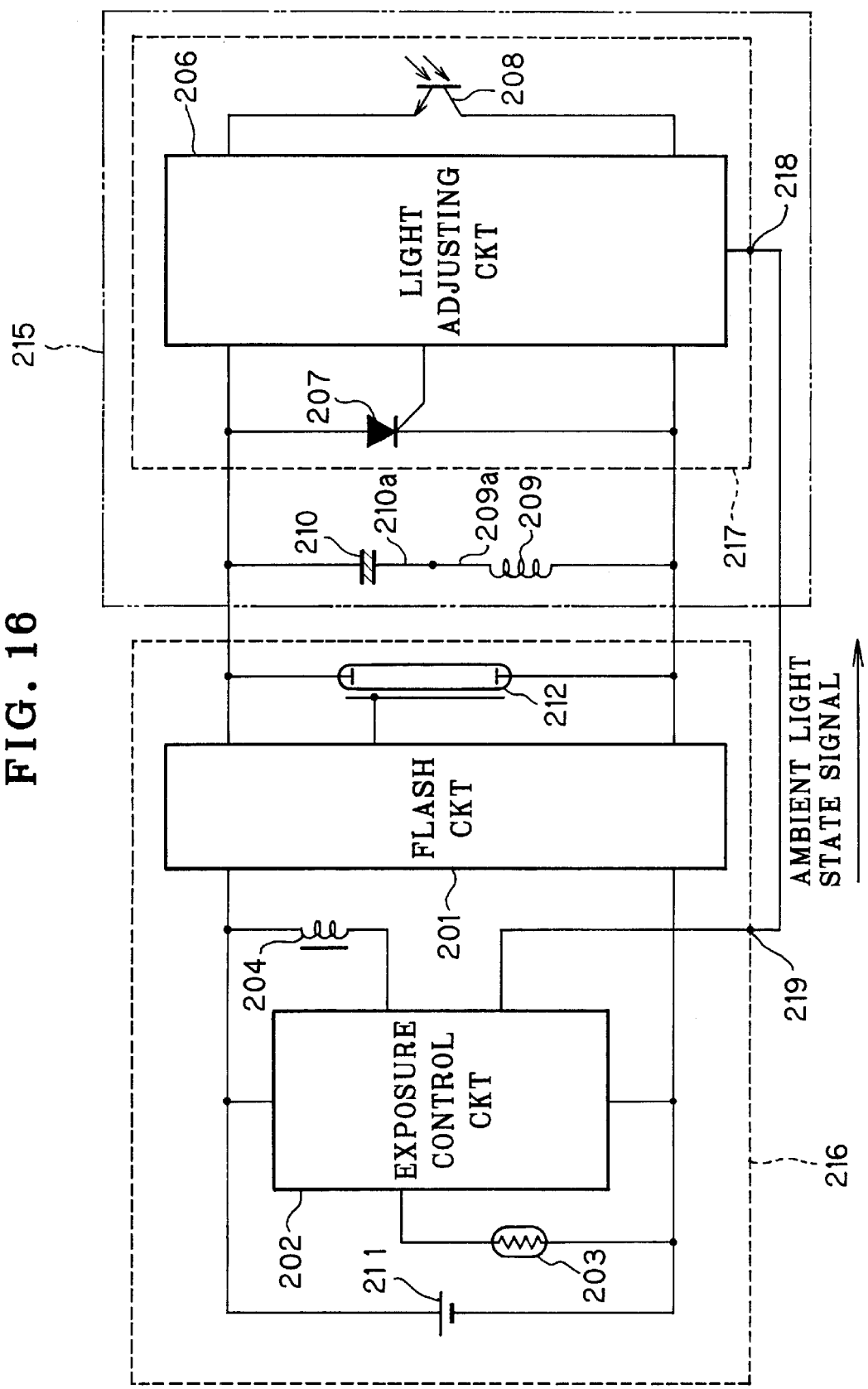
FIG. 16 is a block diagram illustrating circuits of another flash device including an exposure control circuit additional to the flash quenching circuit.

Another preferred embodiment is described, in which a structure for controlling stop of a photographic light path is added. In FIG. 16, a main circuit board includes a flash circuit 201 or main circuit element group, and an exposure control circuit 202. On the main circuit board are mounted a CdS photoreceptor element 203 and a solenoid 204. The CdS photoreceptor element 203 measures a light amount of ambient light. The solenoid 204 is driven to change over the aperture stop. A flash quenching circuit or light adjusting circuit 206 is included in a subsidiary circuit board, on which a thyristor 207 and a photo transistor 208 as photometric element are mounted. A choke coil 209 is associated with a main capacitor 210. The subsidiary circuit board is attached to the main capacitor 210 to construct a main capacitor unit 215. The choke coil 209 has a first end portion 209a, with which a negative terminal pin 210a of the main capacitor 210 is connected. Note that a battery 211 supplies power. A flash discharge tube 212 emits flash to illuminate a photographic field.

Figure 17:
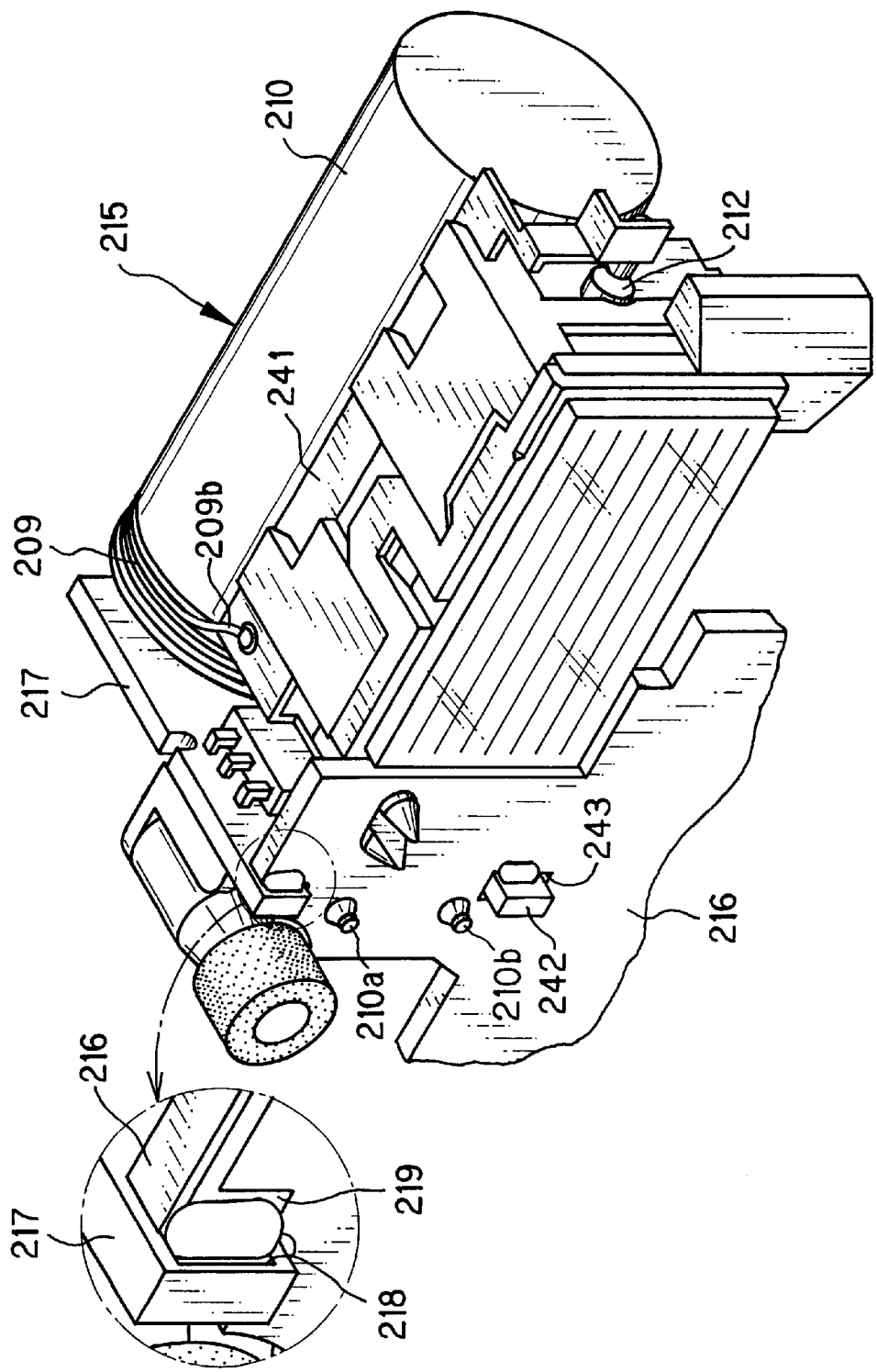
FIG. 17 is a perspective, partially broken, illustrating a flash device with another preferred combination of main and subsidiary circuit boards.

In FIG. 17, assembly of the main capacitor unit 215 is depicted. A subsidiary circuit board 217 is oriented substantially perpendicular to a main circuit board 216. The negative terminal pin 210a and a positive terminal pin 210b of the main capacitor 210 are attached to contact points of the flash circuit 201. Also, an input terminal 218 of the subsidiary circuit board 217 is attached by soldering to an output terminal 219 of a line from the exposure control circuit 202 in the main circuit board 216. Therefore, the flash quenching circuit 206 is connected with the exposure control circuit 202. An ambient light state signal can be output to the flash quenching circuit 206. As the main circuit board 216 is soldered to the subsidiary circuit board 217, the fastening structure can be firm. A second end portion 209b of the choke coil 209 is attached by soldering to a metal contact segment 241 connected with one electrode of the flash discharge tube 212. Thus, it is possible to provide automatic light adjustment in the flash device. Furthermore, a projection 242 may be formed on the subsidiary circuit board 217. An opening 243 may be formed in the main circuit board 216, and receive insertion of the projection 242. Contact points at the projection 242 can be attached to contact points near to the opening 243 by soldering. As the main circuit board 216 is soldered to the subsidiary circuit board 217 in the two positions, the fastening structure is remarkably firm.

Figure 18:
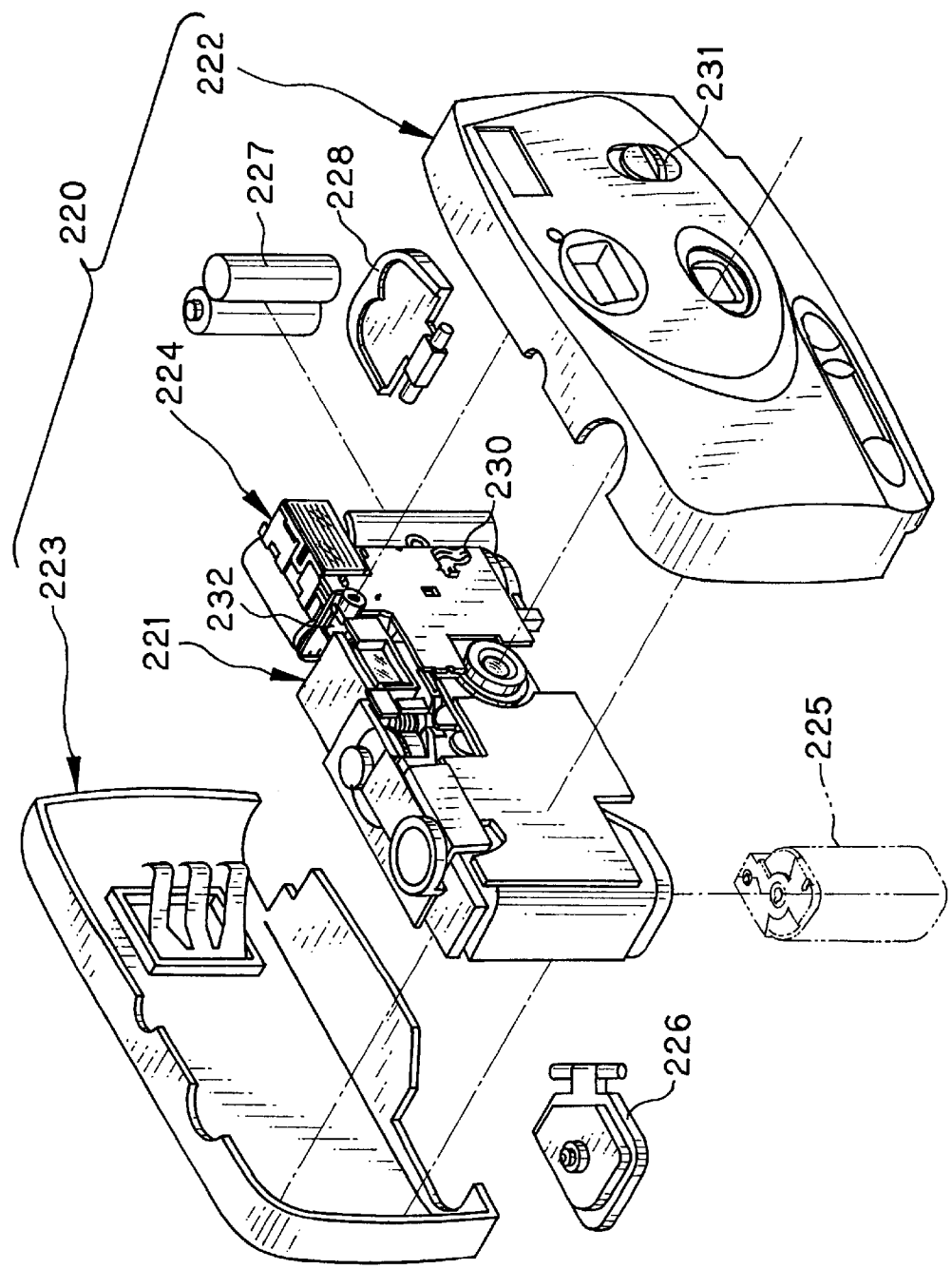
FIG. 18 is an exploded perspective illustrating another preferred camera.

In FIG. 18, a compact camera of the invention is illustrated. A camera 220 includes a main body 221, and a front cover 222 and a rear cover 223 for covering the front and rear of the main body 221. The main body 221 includes a shutter mechanism, photo film advancing mechanism and the like for taking an exposure. A flash device 224 is disposed between the main body 221 and the front cover 222. Unlike the flash device 124 according to FIG. 11, the flash device 224 does not have the battery contact segments 131. However, remaining portions of the flash device 224 are the same as those of the flash device 124. Note that the flash device 224 of the invention is provided with the main capacitor unit 126 according to the above embodiments. A cassette chamber lid 226 is disposed on a lower face of the camera 220 for inserting a photo film cassette 225. Batteries 227 supply power. A battery chamber lid 228 is opened and closed for loading of the batteries 227.

A charger button 231 is disposed in the front cover 222. A charger power switch 230 of the flash device 224 is turned on upon pushing of the charger button 231. When flash light is emitted and directed back by reflection, a light measuring device 232 with a photometric element measures the reflected flash light. When an integration amount of the reflected light comes up to a predetermined level, flash emission is quenched. Thus, the flash light applied in taking an exposure is optimized.

Figure 19:
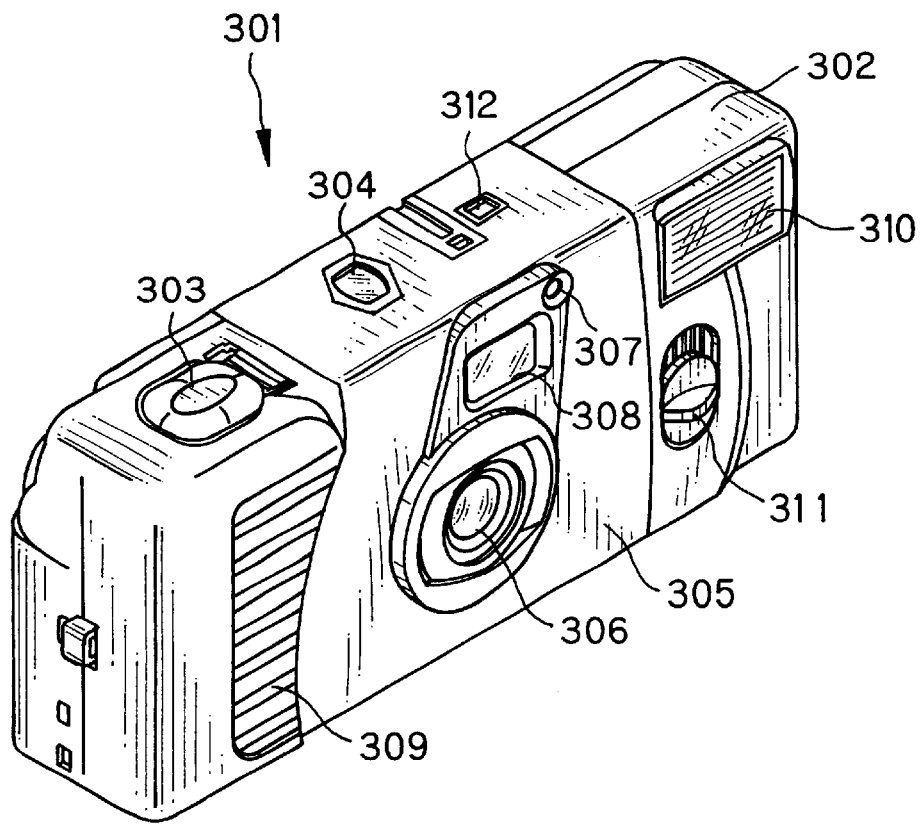
FIG. 19 is a perspective illustrating still another preferred lens-fitted photo film unit.

A further preferred embodiment is described with reference to FIGS. 19–26, in which a discharge tube case is used. In FIG. 19, a lens-fitted photo film unit 301 has a housing 302 basically formed from plastic material. In an upper face of the housing 302, there are a shutter release button 303 and a frame counter window 304, where the number of remaining available frames is indicated. A packaging belt 305 is wound on the outside of the housing 302. A taking lens 306 appears in a front face of the housing 302. There is a photometric window 307, behind which a photometric element is disposed for detecting reflected flash light from a photographic field. A viewfinder objective window 308 is disposed higher than the taking lens 306, and has a viewfinder objective lens. A grip 309 is formed in the housing 302, and includes patterned projections for preventing slipping. A flash emitter 310 is incorporated for emitting flash light.

Figure 20:
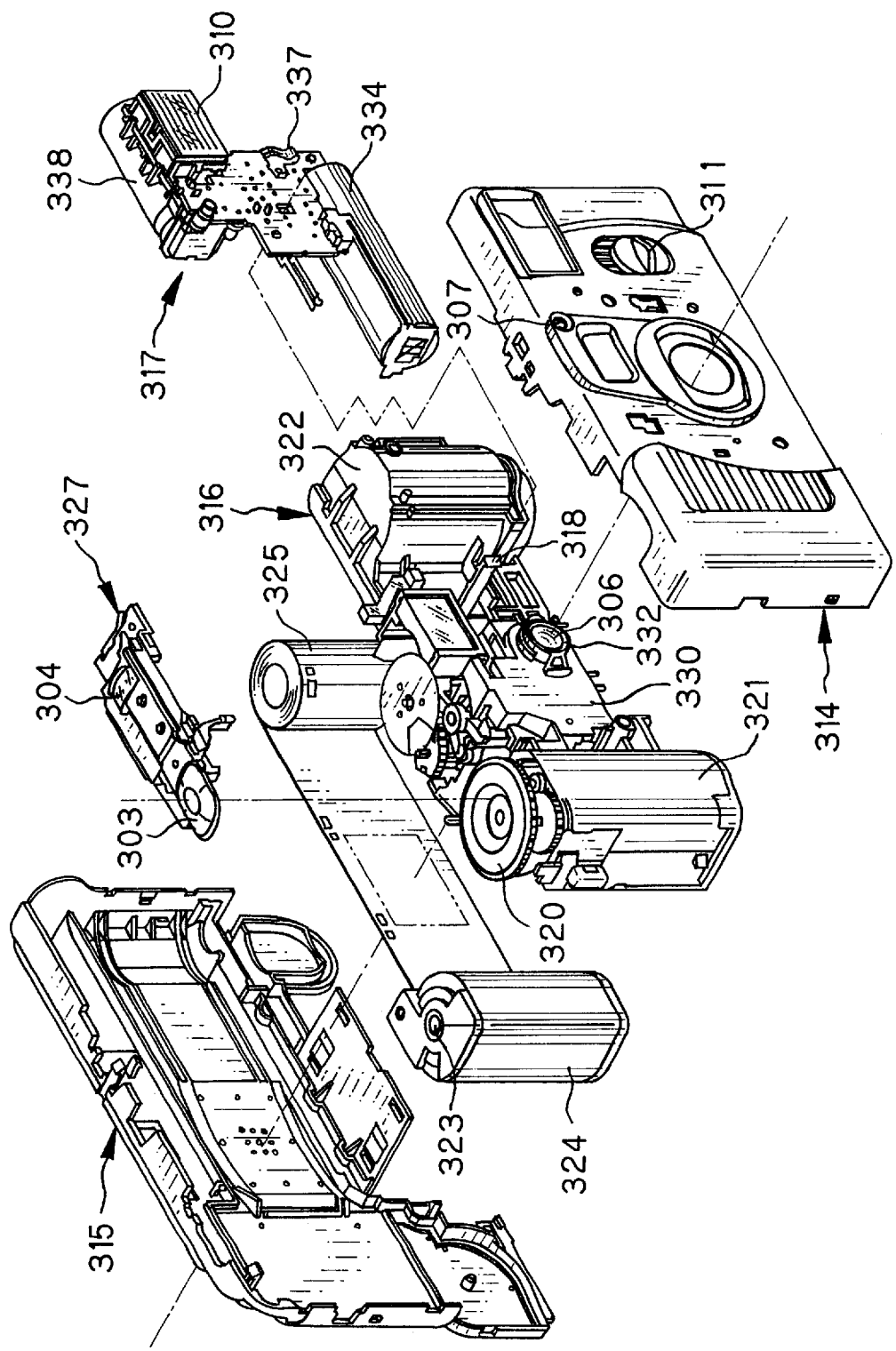
FIG. 20 is an exploded perspective illustrating the lens-fitted photo film unit of FIG. 19.

In FIG. 20, the lens-fitted photo film unit 301 includes a main body 316, a front cover 314 and a rear cover 315. The front cover 314 and the rear cover 315 cover the front and rear of the main body 316. A flash device 317 includes a main circuit board and a main circuit element group mounted on the main circuit board. A fastening projection 318 is formed to project from the main body 316, and fastens the flash device 317 on the main body 316 behind the front cover 314.

The main body 316 includes a cassette holder chamber 321 and a photo film chamber 322 both formed by molding of the plastic material. The cassette holder chamber 321 is used to contain a photo film cassette 324. The photo film chamber 322 is used to contain a roll of photo film 325 which has been drawn out of the photo film cassette 324 and externally wound in the roll form. A cassette spool 323 in the photo film cassette 324 becomes engaged with a core portion of the winder wheel 320.

An upper combination plate 327 is secured to an upper wall of the main body 316.

In front of the shutter blade are disposed a lens holder 330, an aperture stop plate, the taking lens 306 and a fastening plate 332.

The flash device 317 includes a main circuit board 317a. A battery contact segment 335 and the flash emitter 310 are fixedly secured to the main circuit board 317a. The battery contact segment 335 supports and contacts a battery 334. A sync switch 336, a charger power switch 337 and a main capacitor 338 are directly connected with the main circuit board 317a among various circuit elements for the flash circuit. The sync switch 336 is turned on by opening operation of the shutter blade. The charger power switch 337 is turned on by a shift of the charger button 311. The main capacitor 338 stores charge at a high voltage.

Figure 21:
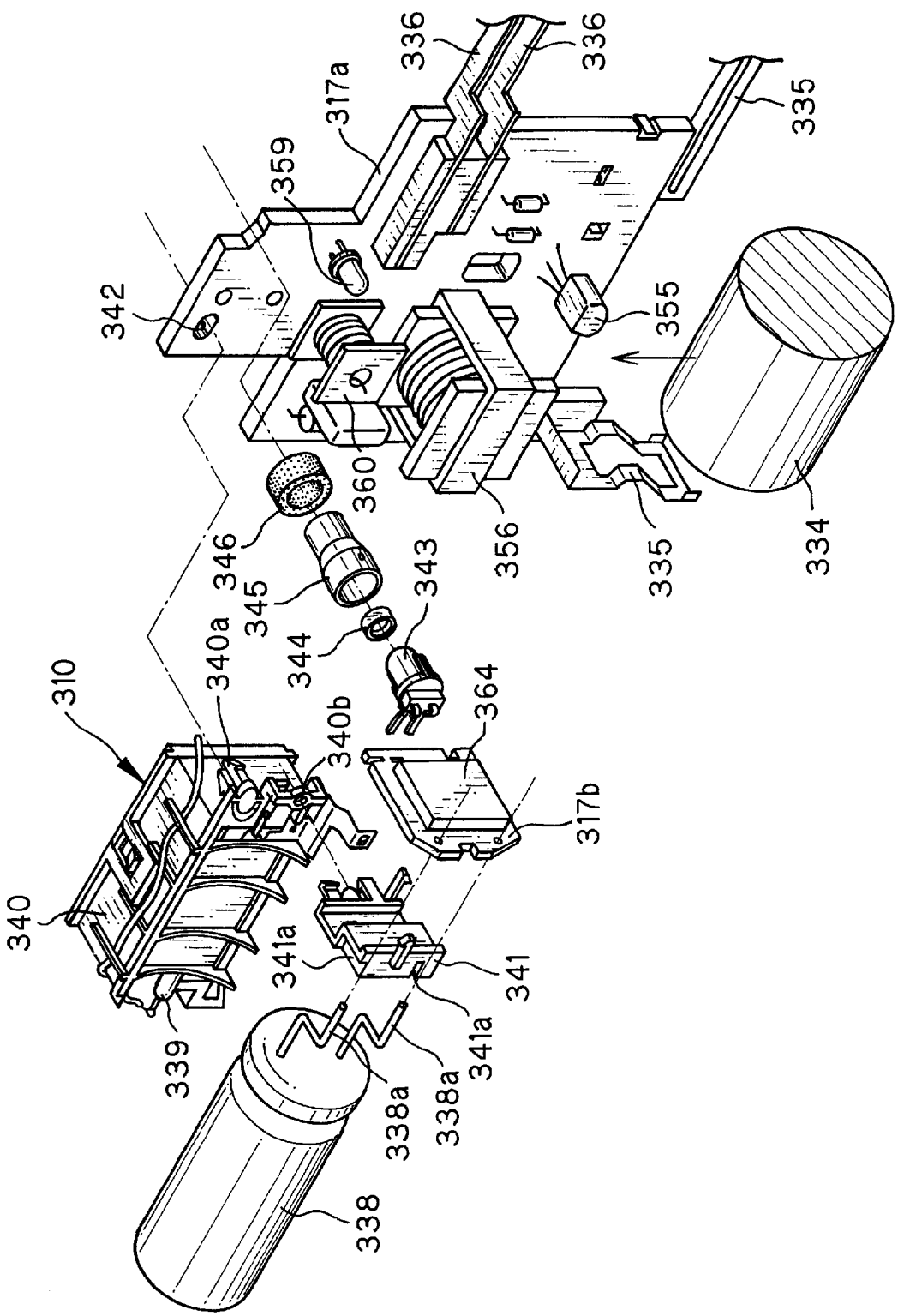
FIG. 21 is an exploded perspective illustrating a flash device with main and subsidiary circuit boards.

In FIG. 21, the flash emitter 310 includes a flash discharge tube 339 and a discharge tube case 340. The flash discharge tube 339 is supplied with power by the main capacitor 338 charged at a high voltage, and emits flash light. The discharge tube case 340 contains the flash discharge tube 339. A projection 340a is formed to project from an end of the discharge tube case 340. A retention hole 342 is formed in the main circuit board 317a, retains the projection 340a to fasten the discharge tube case 340 to the main circuit board 317a.

The main capacitor 338 has a pair of capacitor terminal pins 338a, which are attached by soldering to a subsidiary circuit board 317b. However, a support plate 341 is disposed between the subsidiary circuit board 317b and the main capacitor 338. Also, a photo transistor 343 as a photometric element is mounted on the subsidiary circuit board 317b for measuring reflected flash light. A light reducing filter 344 is disposed in front of the photo transistor 343. A photometric element cover 345 is disposed about the photo transistor 343. A cushioning tube 346 made of sponge, polyurethane foam or other porous material is fitted on the outside of the photometric element cover 345. It follows that a main capacitor unit 348 is constructed by the subsidiary circuit board 317b and the main capacitor 338 mounted on the subsidiary circuit board 317b.

Figure 22:
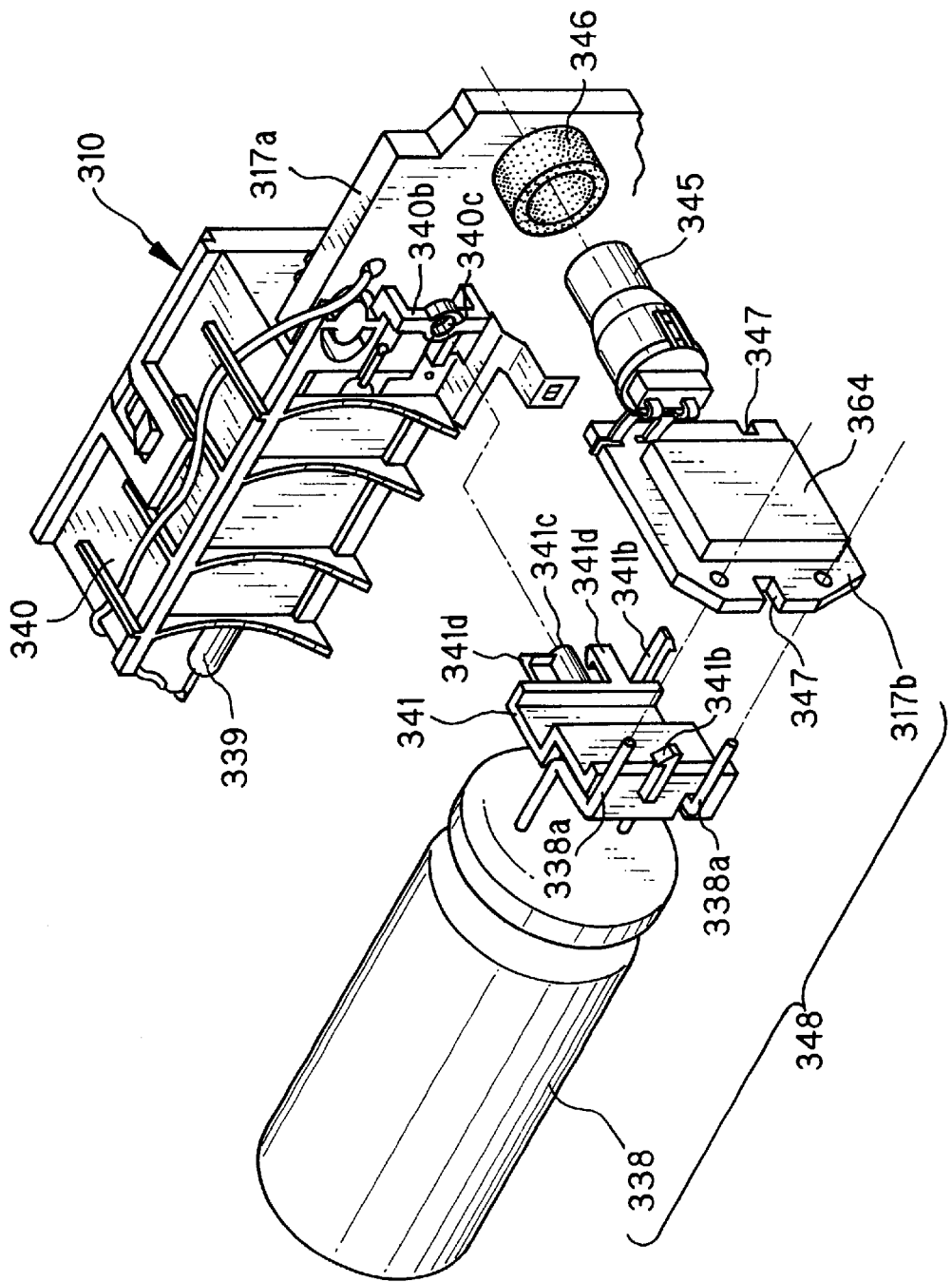
FIG. 22 is an exploded perspective illustrating a state of connecting a main capacitor with a subsidiary circuit board.

Grooves 341a are formed in the support plate 341, receive insertion of the capacitor terminal pins 338a that are bent rectangularly at two points. The main capacitor 338 is precisely positioned on the support plate 341 by the insertion into the support plate 341. In FIG. 22, two retention hooks 341b are formed to project from the support plate 341, engaged with the inside of cutouts 347 in the subsidiary circuit board 317b, to retain the subsidiary circuit board 317b firmly. A plate engaging ridge 340b is formed to project from the projection 340a, and secures the support plate 341 to the discharge tube case 340 to position the subsidiary circuit board 317b.

Figure 23:
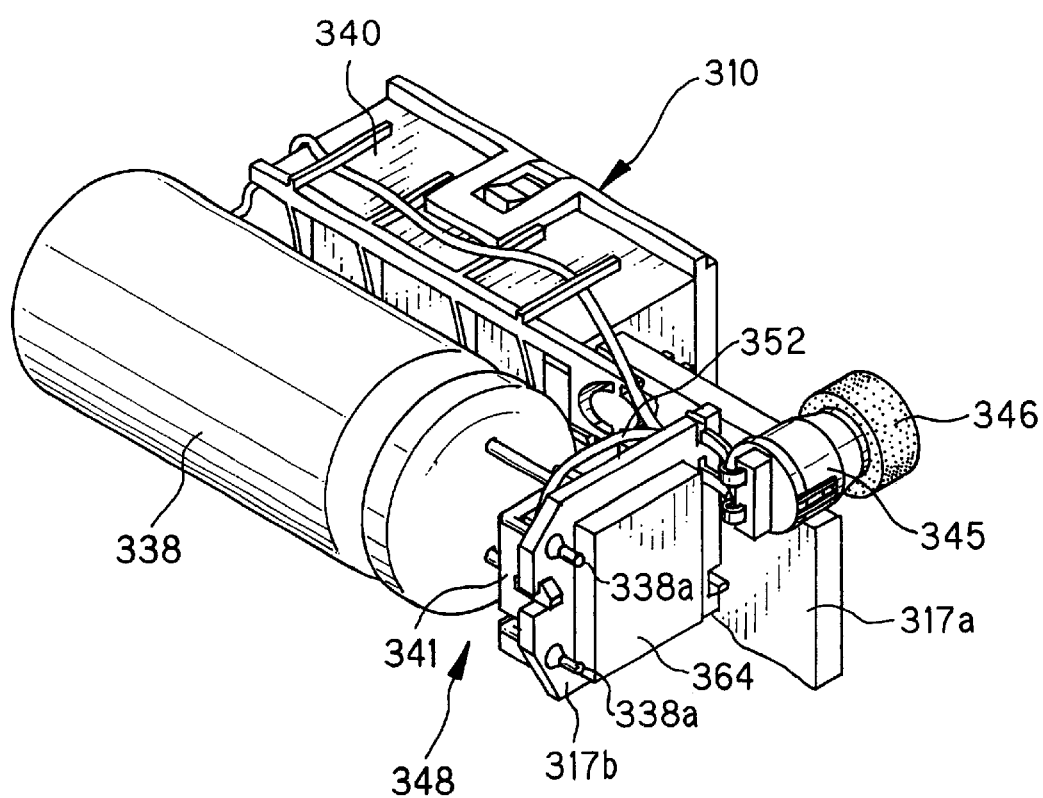
FIG. 23 is a perspective, partially broken, illustrating the same as FIG. 22.

An engagement hole 340c is formed in the plate engaging ridge 340b. An engagement rod 341c projects from the support plate 341, is fitted in the engagement hole 340c to position the support plate 341. Engagement hooks 341d are formed to project from the support plate 341 in upper and lower positions, and engaged with the plate engaging ridge 340b for retention with the engagement rod 341c. Thus, the support plate 341 is fastened to the discharge tube case 340. In FIG. 23, the support plate 341 keeps the subsidiary circuit board 317b fixed substantially perpendicularly with reference to the main circuit board 317a.

Figure 24:
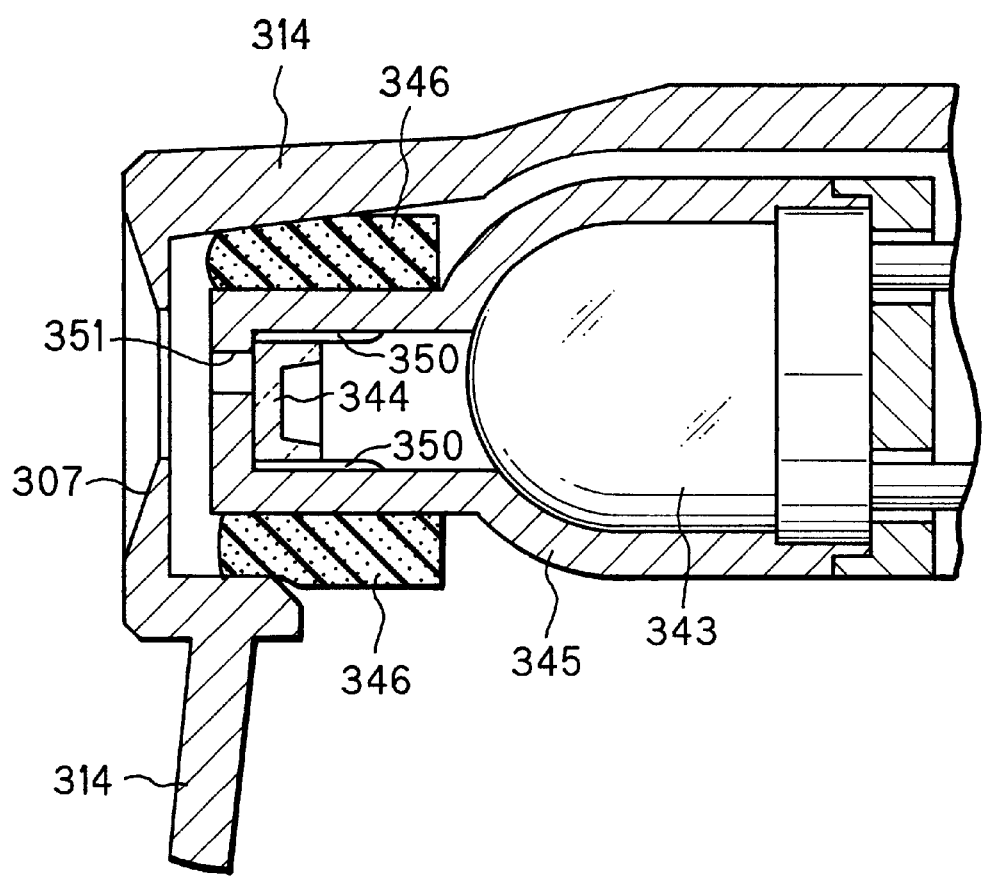
FIG. 24 is a vertical section illustrating a light measuring unit in the flash device of the invention.

In FIG. 24, the photometric element cover 345 covers the photo transistor 343. Press ridges 350 are formed inside the photometric element cover 345, and tightly hold the light reducing filter 344 that is thrust between the press ridges 350. An entrance opening 351 is formed in front of the photometric element cover 345, and is opposed to the photometric window 307. The cushioning tube 346 operates at the time of flash emission, and prevents flash light from entry in the entrance opening 351 even though light leaks from the discharge tube case 340 to the inside of the front cover 314. Thus, the photo transistor 343 detects light only from the photographic field. The light reducing filter 344 is formed from transparent plastic material having a prescribed optical transmittance, and reduces intensity of incident light from the entrance opening 351, to adjust photo sensitivity of the light measuring device with the photo transistor 343. The light reducing filter 344 has optical transmittance that is suitable according to sensitivity of the photo transistor 343. Note that, if the sensitivity of the photo transistor 343 is remarkably high, it is possible to use two or more light reducing filters 344 in the photometric element cover 345 to reduce the intensity of transmitted light.

Figure 25:
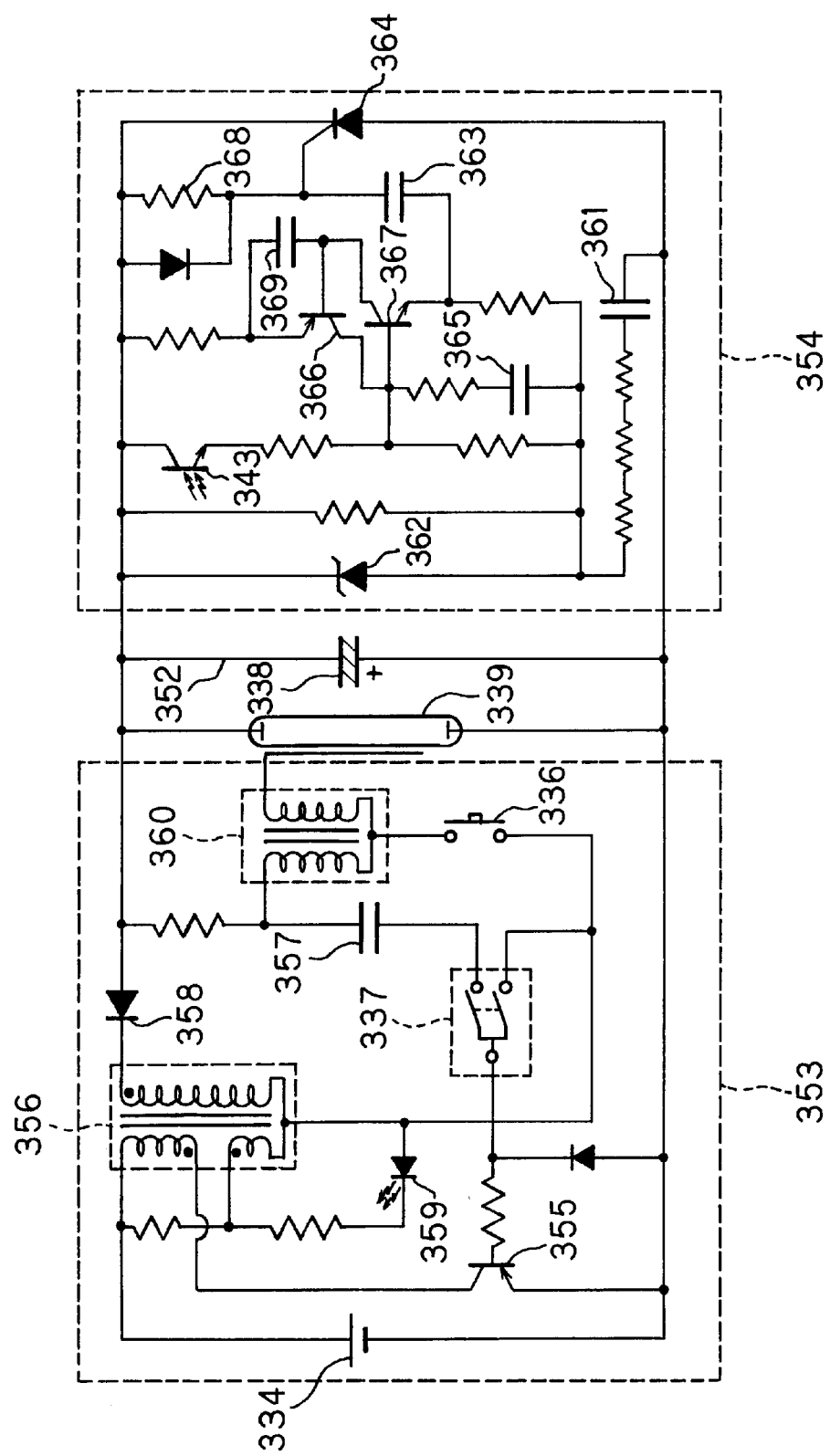
FIG. 25 is a block diagram illustrating circuits in the flash device.

In FIG. 25, a main circuit element group 353 is mounted on the main circuit board 317a. A flash quenching circuit or light adjusting circuit 354 is included in the subsidiary circuit board 317b. The capacitor terminal pins 338a are attached to the subsidiary circuit board 317b by soldering, to connect the flash quenching circuit 354 with the main capacitor 338 electrically. In FIG. 24, a lead wire 352 connects the capacitor terminal pins 338a with the main circuit element group 353. The flash quenching circuit 354 is connected in parallel with the main circuit element group 353 with reference to the main capacitor 338.

The main circuit element group 353 in the main circuit board 317a is supplied with power by the battery 334. The booster circuit or blocking oscillator, which is constituted by an oscillation transistor 355 and an oscillation transformer 356, causes the main circuit element group 353 to charge the main capacitor 338 and a trigger capacitor 357 at a high voltage of approximately 300 volts. A rectification diode 358 is connected between the oscillation transformer 356 and each of the main capacitor 338 and the trigger capacitor 357, for preventing a current from flowing in reverse to a predetermined direction of the current of charging.

A charger button 311 is slid to turn on the charger power switch 337. Then the blocking oscillator is energized to start charging. A light-emitting diode (LED) 359 is driven at the time shortly before the end of the charging operation. A flash standby indicator 312, which transmits light from the LED 359, enables an user to check the completion of the charging with the LED 359.

When the trigger capacitor 357 is discharged, a trigger transformer 360 in the trigger circuit is supplied with a current from the trigger capacitor 357, to generate a breakdown voltage at a high level to trigger the flash discharge tube 339.

A power supply capacitor 361 is included in the flash quenching circuit 354, and stores charge for powering circuit elements in the flash quenching circuit 354. The main circuit element group 353 also operates to charge the power supply capacitor 361 at the same time as charging of the main capacitor 338 and the trigger capacitor 357. There is a Zener diode 362, in which a current of charging the power supply capacitor 361 flows.

Upon application of the breakdown voltage to the flash discharge tube 339, a gate capacitor 363 is also charged according to the flow of a current from the power supply capacitor 361. There is an SCR (silicon controlled rectifier) 364 as tripolar thyristor having a gate terminal, with which the gate capacitor 363 is connected. When the power supply capacitor 361 is discharged, there occurs a potential difference between the emitter and collector of the photo transistor 343. Then reflected flash light is detected by the photo transistor 343, so that a photoelectric current flows according to a detected amount of the light. An integration capacitor 365 is charged by the photoelectric current.

When the integration capacitor 365 is charged up to a predetermined voltage level, then latch transistors 366 and 367 become conductive. Thus, the gate capacitor 363 is discharged. A current from the same flows through a resistor 368. In response to this, a potential difference occurs between a gate and cathode of the SCR 364 at a level that corresponds to a drop in the voltage across the resistor 368, so the SCR 364 is rendered conductive.

When the SCR 364 is rendered conductive, flow of the current caused by the discharge of the main capacitor 338 is changed over from the flash discharge tube 339 to the SCR 364 having smaller resistance. At the same time as the change over, the flash emission is quenched. The remainder of the charge stored in the main capacitor 338 causes a current to flow in the SCR 364. It is to be noted that an auxiliary capacitor 369 prevents the latch transistors 366 and 367 from operating with errors even upon occurrence of electric noises.

Figure 26:
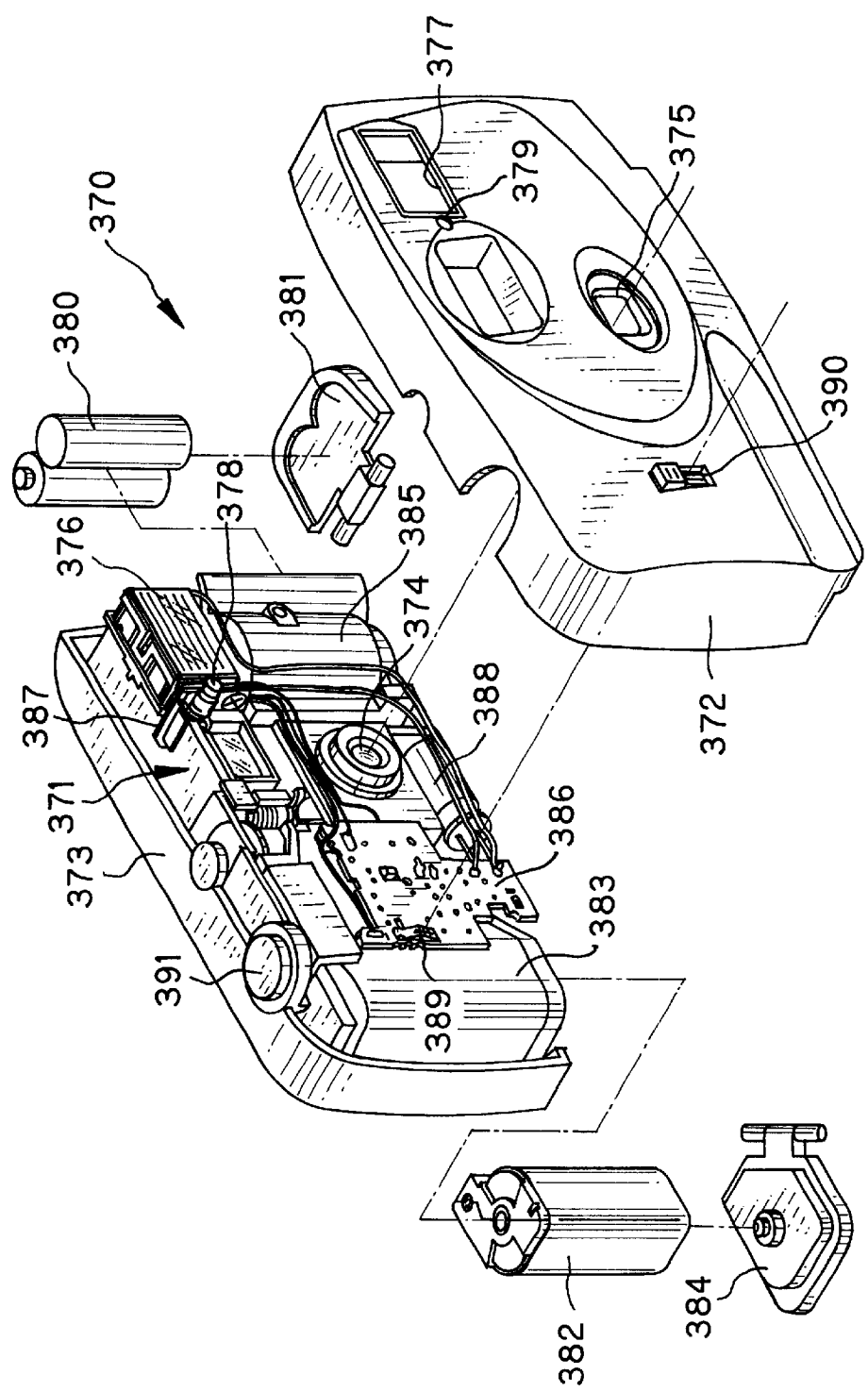
FIG. 26 is an exploded perspective illustrating still another preferred camera.

In FIG. 26, a compact camera 370 of the invention is illustrated, in which the photo film cassette is loadable and removable. The compact camera 370 includes a main body 371, a front cover 372 and a rear cover 373. The front cover 372 includes a lens opening 375, a flash window 377 and a photometric window 379. A taking lens 374 appears in the lens opening 375. A flash emitter 376 appears in the flash window 377. A light measuring device 378 with a photometric element is disposed behind the photometric window 379, and measures reflected flash light. A battery chamber is formed in a side portion of the main body 371, and is loadable with batteries 380. A battery chamber lid 381 is disposed on a lower side of the camera, and openably closes the battery chamber. A cassette holder chamber 383 is also formed in the main body 371, and is loaded with a photo film cassette 382. A cassette chamber lid 384 openably closes the cassette holder chamber 383, and keeps the photo film cassette 382 positioned when locked at the cassette holder chamber 383. There is a photo film chamber 385, into which the photo film is fed by one frame each time after an exposure is taken.

A main circuit board 386 is not provided with the flash emitter 310, the battery contact segment 335, and the sync switch 336 of the main circuit board 317a of FIG. 21. However, a main capacitor 388 is mounted on or directly connected with the main circuit board 386. Other various circuit elements of the main circuit board 386 are the same as those of the main circuit board 317a. A subsidiary circuit board 387 is secured to a lateral wall of the flash emitter 310 by screws and screw holes.

A charger button 390 is disposed in the front cover 372. A charger power switch 389 inside the charger button 390 is turned on by shifting the charger button 390. When a shutter release button 391 is depressed, a shutter blade is actuated behind the taking lens 374.

It is to be noted that, although the main capacitor 388 is disposed under the taking lens 374 according to FIG. 26, a camera of the invention may have the main capacitor 388 disposed behind the flash emitter 376 and beside the subsidiary circuit board 387. In other words, the subsidiary circuit board 387 in the camera may be combined with the main capacitor 388 in a directly connected state to constitute a main capacitor unit.

Furthermore, the subsidiary circuit board 317b, the subsidiary circuit board 387 may be fixedly secured to the discharge tube case 340 by means of adhesive agent in addition to engagement of claws or screws.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A flash device for emitting flash light toward a photographic object, comprising:
   a main circuit board, having a main circuit element mounted thereon for emission of said flash light; and
   a subsidiary circuit board, having a subsidiary circuit element mounted thereon for adjusting an amount of said flash light being emitted;
   wherein the main circuit element comprises:
      a booster circuit for boosting a power source voltage to a high voltage; and
      a main capacitor, connected with said booster circuit, for being charged at said high voltage;
      wherein said main capacitor includes a pair of capacitor terminal pins by which said main and subsidiary circuit boards are connected with one another.

2. A flash device as defined in claim 1, wherein:
   (A) said main circuit element further comprises:
      a flash discharge tube for emitting said flash light upon a flow of a current of discharging said main capacitor;
      a trigger circuit for triggering said flash discharge tube, to discharge said main capacitor;
   (B) said subsidiary circuit element comprises:
      a sensor for measuring said flash light reflected by said photographic object;
      a flash quenching circuit for integration of an output of said sensor, and for quenching flash emission of said flash discharge tube upon a reach of a result of said integration at a predetermined value.

3. A flash device as defined in claim 2, further comprising a pair of holes or grooves, formed in said subsidiary circuit board, for receiving insertion of said capacitor terminal pins through, fixedly to retain said subsidiary circuit board on said main capacitor.

4. A flash device as defined in claim 3, wherein said main capacitor is extended along a straight line passing on a surface of said main circuit board, said pair of said capacitor terminal pins are bent substantially in an L-shape, said subsidiary circuit board is oriented substantially perpendicularly to said main circuit board kept retained by said capacitor terminal pins.

5. A flash device as defined in claim 4, wherein said main circuit element further includes a sync switch for being turned on in synchronism with exposing operation, to operate said trigger circuit.

6. A flash device for emitting flash light toward a photographic object, comprising:
   a main circuit board, having a main circuit element mounted thereon for emission of said flash light; and
   a subsidiary circuit board, having a subsidiary circuit element mounted thereon for adjusting an amount of said flash light being emitted;
   wherein:
      (A) said subsidiary circuit element comprises:
         a main capacitor for being charged at a high voltage;
         a sensor for measuring said flash light reflected by said photographic object;
         a flash quenching circuit for integration of an output of said sensor, and for quenching emission of said flash light upon a reach of a result of said integration at a predetermined value;
      (B) said main circuit element comprises:
         a booster circuit for boosting a power source voltage to said high voltage;
         a flash discharge tube for emitting said flash light upon a flow of a current of discharging said main capacitor;
         a trigger circuit for triggering said flash discharge tube, to discharge said main capacitor; and
         wherein said main capacitor includes a pair of capacitor terminal pins by which said main and subsidiary circuit boards are connected with one another.

7. A producing method of producing a lens-fitted photo film unit, said lens-fitted photo film unit including:
   a main body, having a cassette holder chamber and a photo film chamber, said cassette holder chamber being loaded with a cassette, said photo film chamber being loaded with photo film drawn from said cassette in a roll form;
   front and rear covers for covering respectively a front and a rear of said main body;
   an externally operable charger button disposed in said front cover;
   a photometric window formed in said front cover;
   a flash window formed in said front cover;
   a shutter blade, incorporated in said main body, for providing said photo film with an exposure; and
   a flash device, secured to said main body, and including:
      (A) a charger power switch, disposed behind said charger button, for being turned on by operation of said charger button;
      (B) a booster circuit for boosting power source voltage to obtain high voltage in turning on of said charger power switch;
      (C) a main capacitor, connected with said booster circuit, for being charged at said high voltage;
      (D) a flash discharge tube for emitting flash light upon a flow of a current of discharging said main capacitor;
      (E) a flash emitter for containing said flash discharge tube;
      (F) a sync switch for being turned on in synchronism with actuation of said shutter blade;
      (G) a trigger circuit for triggering said flash discharge tube, to discharge said main capacitor;
      (H) a main circuit board having said booster circuit and said trigger circuit mounted thereon;
      (I) a photometric element, disposed behind said photometric window, for measuring reflected light from a photographic field illuminated by said flash light, and for outputting a photometric signal;
      (J) a flash quenching circuit for obtaining a light amount by integration of said photometric signal, and for discontinuing operation of said flash discharge tube upon a reach of said light amount at a predetermined level;
      (K) a subsidiary circuit board, connected with said main circuit board, having said photometric element and said flash quenching circuit mounted thereon;
   said producing method comprising steps of:
      securing said flash device to said main body to dispose said sync switch in a path of moving said shutter blade;

securing said front cover to said main body to dispose said charger button in front of said charger power switch, and dispose said flash window in front of said flash emitter;

after securing said front cover, inserting said cassette into said cassette holder chamber and said photo film into said photo film chamber;

after inserting said photo film, securing said rear cover to said main body;

said method further comprising the steps of:

attaching a middle of a pair of terminal pins of said main capacitor to said subsidiary circuit board by insertion through holes or grooves in said subsidiary circuit board and by soldering; and attaching an end of said terminal pins to said main circuit board by soldering, to combine said main and subsidiary circuit boards with one another by said terminal pins.

8. A producing method of producing a lens-fitted photo film unit, said lens-fitted photo film unit including:

a main body, having a cassette holder chamber and a photo film chamber, said cassette holder chamber being loaded with a cassette, said photo film chamber being loaded with photo film drawn from said cassette in a roll form;

front and rear covers for covering respectively a front and a rear of said main body;

an externally operable charger button disposed in said front cover;

a photometric window formed in said front cover;

a flash window formed in said front cover;

a shutter blade, incorporated in said main body, for providing said photo film with an exposure; and a flash device, secured to said main body, and including:

(A) a charger power switch, disposed behind said charger button, for being turned on by operation of said charger button;

(B) a booster circuit for boosting power source voltage to obtain high voltage in turning on of said charger power switch;

(C) a main capacitor, connected with said booster circuit, for being charged at said high voltage;

(D) a flash discharge tube for emitting flash light upon a flow of a current of discharging said main capacitor;

(E) a flash emitter for containing said flash discharge tube;

(F) a sync switch for being turned on in synchronism with actuation of said shutter blade;

(G) a trigger circuit for triggering said flash discharge tube, to discharge said main capacitor;

(H) a main circuit board having said booster circuit and said trigger circuit mounted thereon;

(I) a photometric element, disposed behind said photometric window, for measuring reflected light from a photographic field illuminated by said flash light, and for outputting a photometric signal;

(J) a flash quenching circuit for obtaining a light amount by integration of said photometric signal, and for discontinuing operation of said flash discharge tube upon a reach of said light amount at a predetermined level;

(K) a subsidiary circuit board, connected with said main circuit board, having said photometric element and said flash quenching circuit mounted thereon;

said producing method comprising steps of:

securing said flash device to said main body to dispose said sync switch in a path of moving said shutter blade;

securing said front cover to said main body to dispose said charger button in front of said charger power switch, and dispose said flash window in front of said flash emitter;

after securing said front cover, inserting said cassette into said cassette holder chamber and said photo film into said photo film chamber;

after inserting said photo film, securing said rear cover to said main body;

the method comprising the further steps of:

connecting said subsidiary circuit board with said main capacitor, to constitute a main capacitor unit together therewith; and connecting said main capacitor unit with said main circuit board, to constitute said flash device together therewith.

9. A flash device for emitting flash light toward a photographic object, comprising:

a booster circuit for boosting power source voltage to obtain high voltage;

a main capacitor, connected with said booster circuit, for being charged at said high voltage;

a flash discharge tube for emitting said flash light upon a flow of a current of discharging said main capacitor;

a trigger circuit for triggering said flash discharge tube, to discharge said main capacitor;

a main circuit board having said booster circuit and said trigger circuit mounted thereon;

a photometric element for measuring reflected light from a photographic field illuminated by said flash light, and for outputting a photometric signal;

a flash quenching circuit for obtaining a light amount by integration of said photometric signal, and for discontinuing operation of said flash discharge tube upon a reach of said light amount at a predetermined level;

a choke coil bobbin, having a bobbin, and a choke coil wound about said bobbin, and connected with said main capacitor and said flash quenching circuit;

a subsidiary circuit board, connected with said main circuit board, and having said photometric element, said flash quenching circuit and said choke coil bobbin mounted thereon, and firmly fastened on a pair of terminal pins of said main capacitor in an electrical connection therewith.

10. A flash device as defined in claim 9, wherein said bobbin has a hole, formed in a center thereof, for receiving insertion of said capacitor terminal pins, so as to retain said choke coil bobbin on said main capacitor.

11. A flash device as defined in claim 10, wherein said bobbin has a projection for positioning said subsidiary circuit board to said main capacitor.

12. A flash device as defined in claim 11, wherein said capacitor terminal pins are bent in an L-shape to nip said choke coil bobbin and said subsidiary circuit board.

13. A flash device as defined in claim 12, wherein said capacitor terminal pins have a middle attached to said subsidiary circuit board by soldering, and have an end portion attached to said main circuit board.

14. A flash device as defined in claim 11, wherein said capacitor terminal pins have an end portion attached to said subsidiary circuit board by soldering.

15. A flash device as defined in claim 14, wherein said subsidiary circuit board includes a pair of line-shaped subsidiary board terminal patterns with which said main circuit board is connected.

16. A flash device as defined in claim 10, further comprising:
- a photoreceptor element for measuring ambient light from said photographic field;
- an exposure control circuit, mounted on said main circuit board, for sending an ambient light state signal to said flash quenching circuit according to an output from said photoreceptor element;
- wherein said flash quenching circuit determines said predetermined level of said light amount of said reflected light in consideration of said ambient light state signal.

17. A flash device as defined in claim 16, wherein said subsidiary circuit board is fastened on said main circuit board in a direction perpendicular thereto;
- said exposure control circuit includes an output terminal disposed on a contact surface of said main circuit board opposed to said subsidiary circuit board, for outputting said ambient light state signal;
- said flash quenching circuit includes an input terminal disposed on a contact surface of said subsidiary circuit board opposed to said main circuit board, and connected with said output terminal.

18. A flash device as defined in claim 10, wherein said main and subsidiary circuit boards are incorporated in a lens-fitted photo film unit pre-loaded with photo film.

19. A flash device as defined in claim 10, wherein said main and subsidiary circuit boards are incorporated in a camera for being loaded with photo film removably.

20. A flash device for emitting flash light toward a photographic object, comprising:
- a booster circuit for boosting a power source voltage to a high voltage;
- a main capacitor, connected with said booster circuit, for being charged at said high voltage;
- a flash discharge tube for emitting said flash light upon a flow of a current of discharging said main capacitor;
- a trigger circuit for triggering said flash discharge tube, to discharge said main capacitor;
- a main circuit board having said booster circuit and said trigger circuit mounted thereon;
- a discharge tube case, secured to said main circuit board, for containing said flash discharge tube;
- a photometric element for measuring reflected light from a photographic field illuminated by said flash light, and for outputting a photometric signal;
- a flash quenching circuit for obtaining a light amount by integration of said photometric signal, and for discontinuing operation of said flash discharge tube upon a reach of said light amount at a predetermined level; and
- a subsidiary circuit board, secured to said discharge tube case, and having said photometric element, said flash quenching circuit and said main capacitor mounted thereon.

21. A flash device as defined in claim 20, further comprising a support plate, secured to said discharge tube case, for retaining said subsidiary circuit board.

22. A flash device as defined in claim 21, wherein said subsidiary circuit board is oriented substantially perpendicularly to said main circuit board.

23. A flash device as defined in claim 22, wherein said support plate is secured to a rear of said discharge tube case to extend substantially in parallel with said subsidiary circuit board.

24. A flash device as defined in claim 20, wherein said main and subsidiary circuit boards are incorporated in a lens-fitted photo film unit pre-loaded with photo film.

25. A flash device as defined in claim 20, wherein said main and subsidiary circuit boards are incorporated in a camera for being loaded with photo film removably.

26. A producing method of producing a lens-fitted photo film unit, said lens-fitted photo film unit including:
- a main body, having a cassette holder chamber and a photo film chamber, said cassette holder chamber being loaded with a cassette, said photo film chamber being loaded with photo film drawn from said cassette in a roll form;
- front and rear covers for covering respectively a front and a rear of said main body;
- an externally operable charger button disposed in said front cover;
- a photometric window formed in said front cover;
- a flash window formed in said front cover;
- a shutter blade, incorporated in said main body, for providing said photo film with an exposure; and
- a flash device, secured to said main body, and including:
  - (A) a charger power switch, disposed behind said charger button, for being turned on by operation of said charger button;
  - (B) a booster circuit for boosting power source voltage to obtain high voltage in turning on of said charger power switch;
  - (C) a main capacitor, connected with said booster circuit, for being charged at said high voltage;
  - (D) a flash discharge tube for emitting flash light upon a flow of a current of discharging said main capacitor;
  - (E) a sync switch for being turned on in synchronism with actuation of said shutter blade;
  - (F) a trigger circuit for triggering said flash discharge tube, to discharge said main capacitor;
  - (G) a main circuit board having said booster circuit and said trigger circuit mounted thereon;
  - (H) a discharge tube case, secured to said main circuit board, for containing said flash discharge tube;
  - (I) a photometric element for measuring reflected light from a photographic field illuminated by said flash light, and for outputting a photometric signal;
  - (J) a flash quenching circuit for obtaining a light amount by integration of said photometric signal, and for discontinuing operation of said flash discharge tube upon a reach of said light amount at a predetermined level; and
  - (K) a subsidiary circuit board, secured to said discharge tube case, and having said photometric element, said flash quenching circuit and said main capacitor mounted thereon;
- said producing method comprising steps of:
  - securing said flash device to said main body;
  - securing said front cover to said main body to cover said flash device;
  - inserting said cassette with said photo film into said main body; and
  - securing said rear cover to said main body.

27. A producing method as defined in claim 26, further comprising steps of:
- securing said discharge tube case to said main circuit board;
- connecting said main capacitor with said subsidiary circuit board; and
- securing said subsidiary circuit board to said discharge tube case, to constitute said flash device.

* * * * *